US007505891B2

(12) United States Patent
Lin

(10) Patent No.: US 7,505,891 B2
(45) Date of Patent: Mar. 17, 2009

(54) MULTI-USER SERVER SYSTEM AND METHOD

(75) Inventor: Sharon Sheau-Pyng Lin, Cupertino, CA (US)

(73) Assignee: Verisity Design, Inc., Mountain View, CA (US)

( * ) Notice: Subject to any disclaimer, the term of this patent is extended or adjusted under 35 U.S.C. 154(b) by 499 days.

(21) Appl. No.: 10/442,850

(22) Filed: May 20, 2003

(65) Prior Publication Data

US 2004/0236556 A1 Nov. 25, 2004

(51) Int. Cl.
*G06F 9/455* (2006.01)
(52) U.S. Cl. ....................................................... 703/27
(58) Field of Classification Search .................... 703/27
See application file for complete search history.

(56) References Cited

U.S. PATENT DOCUMENTS

| 5,036,473 | A |   | 7/1991  | Butts et al. ............. 703/23 |
|-----------|---|---|---------|----------------------------------|
| 5,109,353 | A |   | 4/1992  | Sample et al. .......... 716/17   |
| 5,212,777 | A | * | 5/1993  | Gove et al. ............ 712/229  |
| 5,448,496 | A |   | 9/1995  | Butts et al. ............. 716/16 |
| 5,551,013 | A |   | 8/1996  | Beausoleil et al. ...... 703/23   |
| 5,946,472 | A | * | 8/1999  | Graves et al. .......... 703/6    |
| 6,035,117 | A |   | 3/2000  | Beausoleil et al. ...... 703/25   |
| 6,051,030 | A |   | 4/2000  | Beausoleil et al. ...... 703/28   |
| 6,094,715 | A |   | 7/2000  | Wilkinson et al. ....... 712/20   |
| 6,134,516 | A |   | 10/2000 | Wang et al. ............ 703/27   |
| 6,917,998 | B1| * | 7/2005  | Giles .................. 710/300  |
| 6,970,966 | B2| * | 11/2005 | Gemelli et al. ......... 710/305  |

OTHER PUBLICATIONS

"Accelerated Graphics Port Interface Specification," May 4, 1998, *Accelerated Graphics Port*, Revision 2.0, Intel Corporation.

El-Ghazawi Tarek, Alexandridis Nikitas, et al., "Productive Use of Distributed Reconfigurable Computing Resources", Lucite Technical Task Order, Nov. 21, 2000, pp. 1-32.

Wigley, G., et al., "The First Real Operating System for Reconfigurable Computers", Proceedings 6th Australasian Computer Systems Architectural Conference. ACSAC 2001, Jan. 29, 2001, pp. 130-137.

Li, Z., et al., "Configuration Caching Management Techniques for Reconfigurable Computing", Field-Programmable Custom Computing Machines, 2000 IEEE Symposium on Napa Valley, Ca., USA Apr. 17-19, 2000, Los Alamitos, Ca., U.S.A, IEEE Comput. Soc., U.S., Apr. 17, 2000, pp. 22-36.

Compton, K., Hauch, S., "Reconfigurable Computing: A Survey of Systems and Software", ACM Computing Surveys, ACM, New York, U.S., vol. 34, No. 2, Jun. 2002 p. 171 and 210.

\* cited by examiner

*Primary Examiner*—Paul L Rodriguez
*Assistant Examiner*—Juan C Ochoa
(74) *Attorney, Agent, or Firm*—Moser IP Law Group

(57) ABSTRACT

The multi-user server technology allows multiple host stations to configure, load, and execute multiple jobs in a reconfigurable hardware unit for emulation purposes, simulation acceleration purposes, and a combination of emulation and simulation in a concurrent manner. The reconfigurable hardware unit includes a plurality of hardware resources (e.g., FPGA chips on slot module boards) for modeling at least a portion of one or more user design. The server includes a bus arbiter for deciding which one of the host stations will be coupled to the hardware resources via the bus multiplexer. The plurality of hardware resources includes slot modules, which includes one or more boards of FPGA chips. An arbitration decision is made to assign a particular slot(s) to a particular host. A host and its respective assigned slot(s) can communicate with each other while other hosts and their respective assigned slot(s) communicate with each other.

21 Claims, 17 Drawing Sheets

Bus Arbitration for a Multi-User Server

Table of Slot-Allocation in Arbiter: control bus-switch

|       | SLOT1 | SLOT2 | SLOT3 | SLOT4 | SLOT5 |
|-------|-------|-------|-------|-------|-------|
| HOST1 | 0 | 0 | 0 | 0 | 0 |
| HOST2 | 0 | 0 | 0 | 0 | 0 |
| HOST3 | 1 | 1 | 0 | 0 | 0 |
| HOST4 | 0 | 0 | 0 | 1 | 1 |
| HOST5 | 0 | 0 | 1 | 0 | 0 |

⎣— HOST3 sends command to request SLOT1 and SLOT2.

Select from all host buses for slot3 bus

MULTI-USER SERVER SYSTEM AND METHOD

BACKGROUND OF THE INVENTION

1. Field of the Invention

The present invention generally relates to electronic design automation (EDA). More particularly, the present invention relates to server systems accessible by multiple clients.

2. Description of Related Art

In general, electronic design automation (EDA) is a computer-based tool configured in various workstations to provide designers with automated or semi-automated tools for designing and verifying user's custom circuit designs. EDA is generally used for creating, analyzing, and editing any electronic design for the purpose of simulation, emulation, prototyping, execution, or computing. EDA technology can also be used to develop systems (i.e., target systems) which will use the user-designed subsystem or component. The end result of EDA is a modified and enhanced design, typically in the form of discrete integrated circuits or printed circuit boards, that is an improvement over the original design while maintaining the spirit of the original design.

The value of software simulating a circuit design followed by hardware emulation is recognized in various industries that use and benefit from EDA technology. Nevertheless, current software simulation and hardware emulation/acceleration are cumbersome for the user because of the separate and independent nature of these processes. For example, the user may want to simulate or debug the circuit design using software simulation for part of the time, use those results and accelerate the simulation process using hardware models during other times, inspect various register and combinational logic values inside the circuit at select times, and return to software simulation at a later time, all in one debug/test session. One solution was provided in U.S. Pat. No. 6,009,256 (assigned to Axis Systems, Inc.) where a simulator is integrated with a hardware emulator in a unique way to increase flexibility.

To conserve resources, it is particularly beneficial to allow multiple users to access this simulator/emulator system from their individual workstations. Although the prior art does not contain any such simulation/emulation system as described in U.S. Pat. No. 6,009,256 (assigned to Axis Systems, Inc.), other art can be examined to determine how others attempted to solve the problem of multiple users accessing a common resource.

Prior art systems can be classified under two categories: (1) switched systems, and (2) bussed systems. Switched systems employ switches that connect the processor to resources in a point-to-point manner. For each switched data path, only two connections exist. An example is IBM mainframes as described in U.S. Pat. No. 6,094,715 which details a massively parallel processing engine which interconnects 128,000 processors together through crossbar switches. This system connects processors to memories and other resources in a point-to-point manner. It does not connect multiple host busses to multiple modules in a simulation/emulation server.

Bussed systems employ a common electrical bus that interconnects the processor to the memory and I/O controllers Bus systems inside personal computers (PC) follow this model. Some examples are the ISA/EISA standard and the PCI standard. However, these bus systems are passive and the connected devices access the bus in a time-shared manner through request-grant handshaking lines. These types of systems do not dynamically allocate multiple resources to multiple users. Another drawback of the bussed systems is that they incur the overhead of switching among resources on a message-by-message basis.

Accordingly, a need exists in the industry for a system or method that addresses problems raised above by currently known simulation systems, hardware emulation systems, hardware accelerators, co-simulation, and coverification systems. In particular, a need exists for a simulation/emulation server system that allows multiple hosts (workstations) to share and access multiple simulation and emulation resources in a fast and reliable way to switch the individual host's bussed data streams between emulation or simulation resources without embedding any control information in the data stream of the host system bus itself. Also, the system must allow reassignment of resources electronically; that is, without mechanically moving cables or switches.

SUMMARY OF THE INVENTION

One embodiment of the present invention is a simulation/emulation server system that is capable of dynamically allocating multiple resources to multiple hosts. The RCC Computing System contains the computational resources that are necessary to allow the user to simulate the user's entire software-modeled design in software and control the hardware acceleration of the hardware-modeled portion of the design. The RCC Hardware Accelerator contains the reconfigurable array of logic elements (e.g., FPGA) that can model at least a portion of the user's design in hardware so that the user can accelerate the debugging process. The RCC Computing System is tightly coupled to the RCC Hardware Accelerator via the software clock. The RCC system can also be used for emulation purposes.

The multi-user server allows a plurality of host stations to configure, load, and execute multiple jobs in a reconfigurable hardware unit, where each job is associated with a user design, and the reconfigurable hardware unit includes a plurality of hardware resources for modeling at least a portion of one or more user designs. The server includes a bus multiplexer; a host bus for coupling the plurality of host stations to the bus multiplexer; a slot bus for coupling the plurality of hardware resources to the bus multiplexer; and a bus arbiter for deciding which one of the plurality of host stations will be coupled to the plurality of hardware resources via the bus multiplexer.

The plurality of hardware resources includes slot modules, where each slot module includes one or more boards of FPGA chips for reconfigurably loading the user design as a hardware model. Each host bus is associated with a particular host station. Similarly, each slot bus is associated with a particular slot module. When an arbitration decision has been made, the bus multiplexer connects the slot bus associated with the newly assigned slot module to the host bus associated with the winning host station.

In one embodiment, the arbitration decision allows the system to assign a slot or slots to the requesting host. The arbitration decision occurs one at a time; that is, when a host or several hosts request access to certain slot(s), the arbiter determines the winning host and assigns the slot(s) to the winning host. Thereafter, the host can transfer data between itself and the slot(s) at any time through the host bus/slot bus. If the arbiter has assigned slots to several hosts (e.g., slot A to host A and slot B to host B), these hosts can transfer data across the host bus/slot bus concurrently with the other hosts. In other words, host A can transfer data between it and its slot A at the same time that host B is transferring data between it and its slot B.

To communicate with the server, the plurality of host stations includes control logic to deliver a request to the simulation server. The request includes a command type and a slot number, the command type including one of a request status and a request slot, and the slot number indicates a particular one or more slot modules. The bus arbiter includes a status logic for delivering status information to the control logic in the host station in response to a request status by the host station.

Note that in this novel scheme, the arbitration system for the multiple hosts is accomplished in hardware. Control information is not embedded in the data stream of the host or slot bus itself, thus reducing overhead processing. Furthermore, reassignment of resources occurs electronically; that is, the user need not mechanically move cables or switches around. The system is scalable in that the number and configuration of the resources can be changed.

These and other embodiments are fully discussed and illustrated in the following sections of the specification.

BRIEF DESCRIPTION OF THE FIGURES

The above objects and description of the present invention may be better understood with the aid of the following text and accompanying drawings.

DETAILED DESCRIPTION OF PREFERRED EMBODIMENTS

Figure 1:
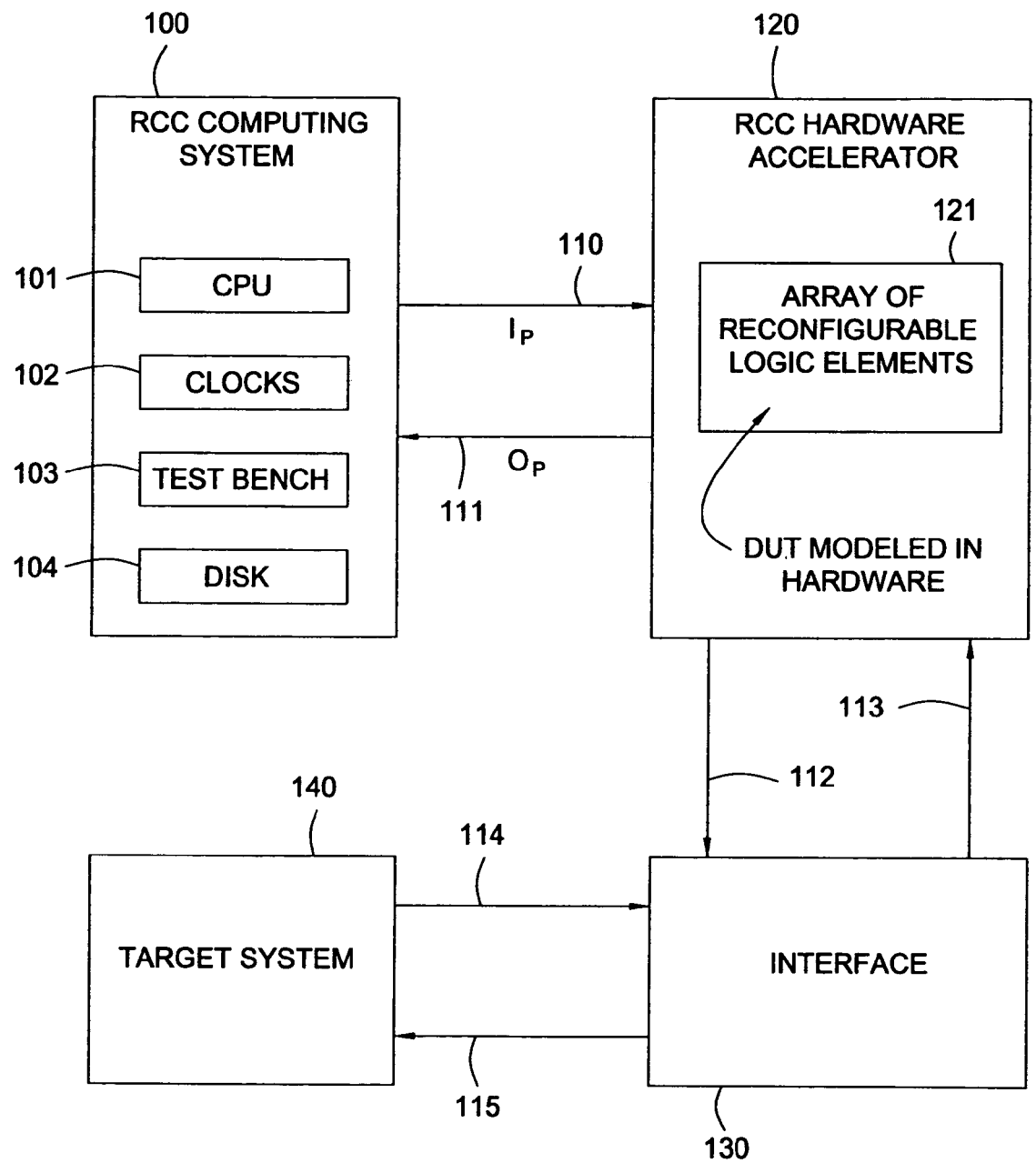
FIG. 1 shows a high level overview of one embodiment of the present invention, including the workstation, reconfigurable hardware emulation model, emulation interface, and the target system.

This specification will describe the various embodiments of the present invention through and within the context of a system called "SEmulator" or "SEmulation" system. Throughout the specification, the terms "SEmulation system," "SEmulator system," "SEmulator," or simply "system" may be used. These terms refer to various apparatus and method embodiments in accordance with the present invention for any combination of four operating modes: (1) software simulation, (2) simulation through hardware acceleration, (3) in-circuit emulation (ICE), and (4) post-simulation analysis, including their respective set-up or pre-processing stages. At other times, the term "SEmulation" may be used. This term refers to the novel processes described herein.

Similarly, terms such as "Reconfigurable Computing (RCC) Array System" or "RCC computing system" refers to that portion of the simulation/coverification system that contains the main processor, software kernel and the software model of the user design. Terms such as "Reconfigurable hardware array" or "RCC hardware array" refers to that portion of the simulation/coverification system that contains the hardware model of the user design and which contains the array of reconfigurable logic elements, in one embodiment.

The specification also makes references to a "user" and a user's "circuit design" or "electronic design." The "user" is a person who uses the SEmulation system through its interfaces and may be the designer of a circuit or a test/debugger who played little or no part in the design process. The "circuit design" or "electronic design" is a custom designed system or component, whether software or hardware, which can be modeled by the SEmulation system for test/debug purposes. In many cases, the "user" also designed the "circuit design" or "electronic design."

The specification also uses the terms "wire, wire line," "wire/bus line," and "bus." These terms refer to various electrically conducting lines. Each line may be a single wire between two points or several wires between points. These terms are interchangeable in that a "wire" may comprise one or more conducting lines and a "bus" may also comprise one or more conducting lines.

This specification is presented as follows: First, the specification presents a general overview of the SEmulator system. Second, the specification provides a detailed discussion of the SEmulator system. In some cases, one figure may provide a variation of an embodiment shown in a previous figure. In these cases, like reference numerals will be used for like components/units/processes.

Overview

The SEmulator system, through automatic component type analysis, can model the user's custom circuit design in software and hardware. The entire user circuit design is modeled in software, whereas evaluation components (i.e., register component, combinational component) are modeled in hardware. Hardware modeling is facilitated by the component type analysis.

A software kernel, residing in the main memory of the general purpose processor system, serves as the SEmulator system's main program that controls the overall operation and execution of its various modes and features. So long as any test-bench processes are active, the kernel evaluates active test-bench components, evaluates clock components, detects clock edges to update registers and memories as well as propagating combinational logic data, and advances the simulation time. This software kernel provides for the tightly coupled nature of the simulator engine with the hardware acceleration engine. For the software/hardware boundary, the SEmulator system provides a number of I/O address spaces— REG (register), CLK (software clock), S2H (software to hardware), and H2S (hardware to software).

The SEmulator has the capability to selectively switch among the four modes of operation. The user of the system can start simulation, stop simulation, assert input values, inspect values, single step cycle by cycle, and switch back and forth among the four different modes. For example, the system can simulate the circuit in software for a time period, accelerate the simulation through the hardware model, and return back to software simulation mode.

Generally, the SEmulation system provides the user with the capability to "see" every modeled component, regardless of whether it's modeled in software or hardware. For a variety of reasons, combinational components are not as "visible" as registers, and thus, obtaining combinational component data is difficult. One reason is that FPGAs, which are used in the reconfigurable board to model the hardware portion of the user's circuit design, typically model combinational components as look-up tables (LUT), instead of actual combinational components. Accordingly, the SEmulation system reads register values and then regenerates combinational components. Because some overhead is needed to regenerate the combinational components, this regeneration process is not performed all the time; rather, it is done only upon the user's request.

Because the software kernel resides in the software side, a clock edge detection mechanism is provided to trigger the generation of a so-called software clock that drives the enable input to the various registers in the hardware model. The timing is strictly controlled through a double-buffered circuit implementation so that the software clock enable signal enters the register model before the data to these models. Once the data input to these register models have stabilized, the software clock gates the data synchronously to ensure that all data values are gated together without any risk of hold-time violations.

Software simulation is also fast because the system logs all input values and only selected register values/states, thus overhead is minimized by decreasing the number of I/O operations. The user can selectively select the logging frequency.

Basic System Description

Various embodiments of the basic simulation/emulation system have been described in U.S. Pat. No. 6,009,256 (assigned to Axis Systems, Inc.). As a refresher, refer to FIG. 1, where a high level view of the RCC System that incorporates one embodiment of the present invention is illustrated. The RCC System includes an RCC Computing System 100 and an RCC Hardware Accelerator 120. The RCC Computing System 100 contains the computational resources that are necessary to allow the user to simulate the user's entire software-modeled design in software and control the hardware acceleration of the hardware-modeled portion of the design. To this end, the RCC Computing System 100 contains the CPU 101, various clocks 102 (including the software clock that is described in U.S. Pat. No. 6,009,256) that are needed by the various components of the RCC System, test bench processes 103, and system disk 104. Although not shown in this general diagram, the RCC Computing System 100 includes other logic components and bus subsystems that provide the circuit designer with the computational power to run diagnostics, various software, and manage files, among other tasks that a computing system performs.

The RCC Hardware Accelerator 120 contains the reconfigurable array 121 of logic elements (e.g., FPGA) that can model at least a portion of the user's design in hardware so that the user can accelerate the debugging process. Because the logic elements are configurable (and reconfigurable) to any user design quickly and on-the-fly, the RCC Hardware Accelerator can be used for an endless variety of different user circuit designs. The RCC Computing System 100 is tightly coupled to the RCC Hardware Accelerator 120 via the software clock and a bus system, a portion of which is shown as lines 110 and 111 in FIG. 1.

FIG. 1 also shows a target system 140 coupled to the RCC Hardware Accelerator 120 via an interface 130, bus lines 112, 113, 114, and 115. The SEmulation system is capable of simulating and emulating the user's circuit within its target system environment. The target system outputs data to the hardware model for evaluation and the hardware model also outputs data to the target system. Additionally, the software kernel controls the operation of this mode so that the user still has the option to start, stop, assert values, inspect values, single step, and switch from one mode to another.

The SEmulation system implements an array of FPGA chips on a reconfigurable board. Based on the hardware model, the SEmulation system partitions, maps, places, and routes each selected portion of the user's circuit design onto the FPGA chips. Thus, for example, a 4×4 array of 16 chips may be modeling a large circuit spread out across these 16 chips. The interconnect scheme allows each chip to access another chip within 2 "jumps" or links.

In another embodiment of the present invention, denser FPGA chips are used. One such denser chip is the Altera 10K130V and 10K250V chips. Use of these chips alters the board design such that only four FPGA chips, instead of eight less dense FPGA chips (e.g., Altera 10K100), are used per board.

The FPGA array in the Simulation system is provided on the motherboard through a particular board interconnect structure. Each chip may have up to eight sets of interconnections, where the interconnections are arranged according to adjacent direct-neighbor interconnects (i.e., N[73:0], S[73:0], W[73:0], E[73:0]), and one-hop neighbor interconnects (i.e., NH[27:0], SH[27:0], XH[36:0], XH[72:37]), excluding the local bus connections, within a single board and across different boards. Each chip is capable of being interconnected directly to adjacent neighbor chips, or in one hop to a non-adjacent chip located above, below, left, and right. In the X direction (east-west), the array is a torus. In the Y direction (north-south), the array is a mesh.

The interconnects alone can couple logic devices and other components within a single board. However, inter-board connectors are provided to couple these boards and interconnects together across different boards to carry signals between (1) the PCI bus via the motherboard and the array boards, and (2) any two array boards. A motherboard connector connects the board to the motherboard, and hence, to the PCI bus, power, and ground.

In this basic system description, a single workstation accesses the RCC system. In the description below, multiple workstations can access the RCC system via a client-server arrangement.

Simulation Server

Server Overview

In another embodiment of the present invention, a Simulation server is provided to allow multiple users to access the same reconfigurable hardware unit. In one system configuration, multiple workstations across a network or multiple users/processes in a non-network environment can access the same server-based reconfigurable hardware unit to review/debug the same or different user circuit design. The access is accomplished via a time-shared process in which a scheduler determines access priorities for the multiple users, swaps jobs, and selectively locks hardware model access among the scheduled users. In one scenario, each user can access the server to map his/her separate user design to the reconfigurable hardware model for the first time, in which case the system compiles the design to generate the software and hardware models, performs the clustering operation, performs place-and-route operations, generates a bitstream configuration file, and reconfigures the FPGA chips in the reconfigurable hardware unit to model the hardware portion of the user's design. When one user has accelerated his design using the hardware model and downloaded the hardware state to his own memory for software simulation, the hardware unit can be released for access by another user.

The server provides the multiple users or processes to access the reconfigurable hardware unit for acceleration and hardware state swapping purposes. The Simulation server includes the scheduler, one or more device drivers, and the reconfigurable hardware unit. The scheduler in the Simulation server is based on a preemptive round robin algorithm. The server scheduler includes a simulation job queue table, a priority sorter, and a job swapper. The restore and playback function of the present invention facilitates the non-network multiprocessing environment as well as the network multi-user environment in which previous checkpoint state data can be downloaded and the entire simulation state associated with that checkpoint can be restored for playback debugging or cycle-by-cycle stepping.

Multi-User Server—One Embodiment

A Simulation server in accordance with another embodiment of the present invention is provided to allow multiple users to access the same reconfigurable hardware unit to effectively simulate and accelerate the same or different user designs in a time-shared manner. A high speed simulation scheduler and state swapping mechanisms are employed to feed the Simulation server with active simulation processes which results in a high throughput. The server provides the multiple users or processes to access the reconfigurable hardware unit for acceleration and hardware state swapping purposes. Once the acceleration has been accomplished or the hardware state has been accessed, each user or process can then simulate in software only, thus releasing control of the reconfigurable hardware unit to other users or processes.

In the Simulation server portion of this specification, terms such as "job" and "process" are used. In this specification, the terms "job" and "process" are generally used interchangeably. In the past, batch systems executed "jobs" and time-shared systems stored and executed "processes" or programs. In today's systems, these jobs and processes are similar. Thus, in this specification, the term "job" is not limited to batch-type systems and "process" is not limited to time-shared systems; rather, at one extreme, a "job" is equivalent to a "process" if the "process" can be executed within a time slice or without interruption by any other time-shared intervenor, and at the other extreme, a "job" is a subset of a "process" if the "job" requires multiple time slices to complete. So, if a "process" requires multiple time slices to execute to completion due to the presence of other equal priority users/processes, the "process" is divided up into "jobs." Moreover, if the "process" does not require multiple time slices to execute to completion because it is the sole high priority user or the process is short enough to complete within a time slice, the "process" is equivalent to a "job." Thus, a user can interact with one or more "processes" or programs that have been loaded and executed in the Simulation system, and each "process" may require one or more "jobs" to complete in a time-shared system.

In one system configuration, multiple users via remote terminals can utilize the same multiprocessor workstation in a non-network environment to access the same reconfigurable hardware unit to review/debug the same or different user circuit design. In a non-network environment, remote terminals are connected to a main computing system for access to its processing functions. This non-network configuration allows multiple users to share access to the same user design for parallel debugging purposes. The access is accomplished via a time-shared process in which a scheduler determines access priorities for the multiple users, swaps jobs, and selectively locks hardware unit access among the scheduled users. In other instances, multiple users may access the same reconfigurable hardware unit via the server for his/her own separate and different user design for debugging purposes. In this configuration, the multiple users or processes are sharing the multiple microprocessors in the workstation with the operating system.

In another configuration, multiple users or processes in separate microprocessor-based workstations can access the same reconfigurable hardware unit to review/debug the same or different user circuit design across a network. Similarly, the access is accomplished via a time-shared process in which a scheduler determines access priorities for the multiple users, swaps jobs, and selectively locks hardware unit access among the scheduled users. In a network environment, the scheduler listens for network requests through UNIX socket system calls. The operating system uses sockets to send commands to the scheduler.

As stated earlier, the Simulation scheduler uses a preemptive multiple priority round robin algorithm. In other words, higher priority users or processes are served first until the user or process completes the job and ends the session. Among equal priority users or processes, a preemptive round robin algorithm is used in which each user or process is assigned an equal time slice to execute its operations until completed. The time slice is short enough such that multiple users or process will not have to wait a long time before being served. The time slice is also long enough such that sufficient operations are executed before the Simulation server's scheduler interrupts one user or process to swap in and execute the new user's job. In one embodiment, the default time slice is 5 seconds and is user settable. In one embodiment, the scheduler makes specific calls to the operating system's built-in scheduler.

Figure 2:
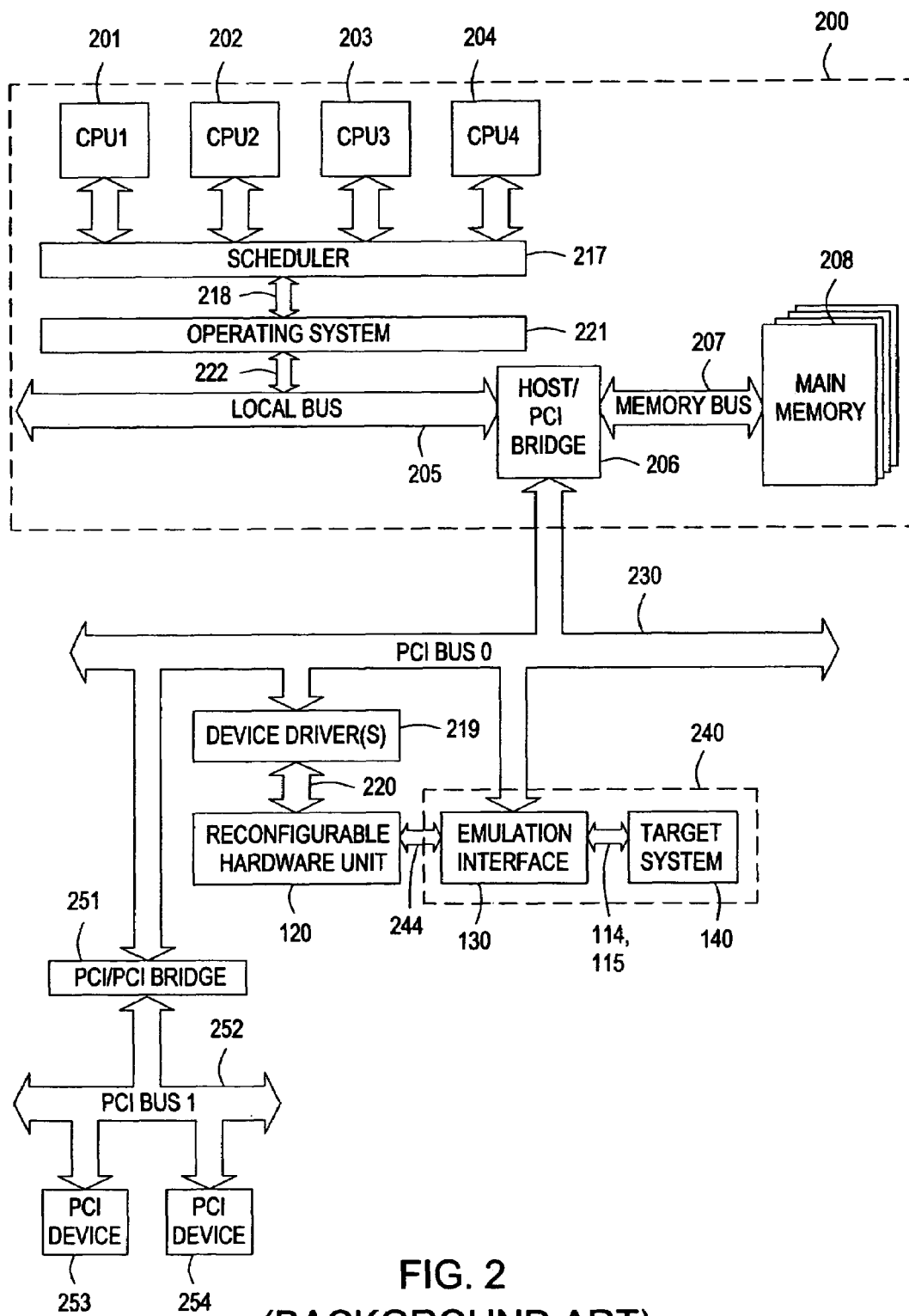
FIG. 2 shows a workstation with multiprocessors in accordance with another embodiment of the present invention.

FIG. 2 shows a non-network environment with a multiprocessor workstation in accordance with one embodiment of the present invention. Workstation 200 includes local bus 205, a host/PCI bridge 206, memory bus 207, and main memory 208. A cache memory subsystem (not shown) may also be provided. Other user interface units (e.g., monitor, keyboard) are also provided but not shown in FIG. 2. Workstation 200 also includes multiple microprocessors 201, 202, 203, and 204 coupled to the local bus 205 via a scheduler 217 and connections/path 218. As known to those skilled in the art, an operating system 221 provides the user-hardware interface foundation for the entire computing environment for managing files and allocating resources for the various users, processes, and devices in the computing environment. For conceptual purposes the operating system 221 along with a bus 222 are shown. References to operating systems can be made in Abraham Silberschatz and James L. Peterson, OPERATING SYSTEM CONCEPTS (1988) and William Stallings, MODERN OPERATING SYSTEMS (1996), which are incorporated herein by reference.

In one embodiment, the workstation 200 is a Sun Microsystems Enterprise 450 system which employs UltraSPARC II processors. Instead of the memory access via the local bus, the Sun 450 system allows the multiprocessors to access the memory via dedicated buses to the memory through a crossbar switch. Thus, multiple processes can be running with multiple microprocessors executing their respective instructions and accessing the memory without going through the local bus. The Sun 450 system along with the Sun UltraSPARC multiprocessor specifications are incorporated herein by reference. The Sun Ultra 60 system is another example of a microprocessor system although it allows only two processors.

In one embodiment, communication between the workstation 200 and the reconfigurable hardware model 120 is handled on the PCI bus. These devices may be coupled to the PCI bus at the same level as the workstation 200, reconfigurable hardware model 120, and emulation interface 130, or other levels. Each PCI bus at a different level, such as PCI bus 252, is coupled to another PCI bus level, such as PCI bus 230, if it exists at all, through a PCI-to-PCI bridge 251. At PCI bus 252, two PCI devices 253 and 254 may be coupled therewith.

The scheduler 217 provides the time-shared access to the reconfigurable hardware unit 120 via the device driver 219 and connections/path 220. Scheduler 217 is implemented mostly in software to interact with the operating system of the host computing system and partially in hardware to interact with the Simulation server by supporting the simulation job interruption and swapping in/out the simulation sessions. The scheduler 217 and device driver 219 will be discussed in more detail below.

Each microprocessor 201-204 is capable of processing independently of the other microprocessors in the workstation 200. In one embodiment of the present invention, the workstation 200 is operating under a UNIX-based operating system, although in other embodiments, the workstation 200 can operate under a Windows-based or Macintosh-based operating system. For UNIX-based systems, the user is equipped with X-Windows for the user interface to manage programs, tasks, and files as necessary. For details on the UNIX operating system, reference is made to Maurice J. Bach, THE DESIGN OF THE UNIX OPERATING SYSTEM (1986).

In FIG. 2, multiple users can access workstation 200 via remote terminals. At times, each user may be using a particular Cpu to run its processes. At other times, each user uses different CPUs depending on the resource limitations. Usually, the operating system 221 determines such accesses and indeed, the operating system itself may jump from one CPU to another to accomplish its tasks. To handle the time-sharing process, the scheduler listens for network requests through socket system calls makes system calls to the operating system 221, which in turn handles preemption by initiating the generation of interrupt signals by the device driver 219 to the reconfigurable hardware unit 120. Such interrupt signal generation is one of many steps in the scheduling algorithm which includes stopping the current job, saving state information for the currently interrupted job, swapping jobs, and executing the new job. The server scheduling algorithm will be discussed below.

Sockets and socket system calls will now be discussed briefly. The UNIX operating system, in one embodiment, can operate on a time-sharing mode. The UNIX kernel allocates the CPU to a process for a period of time (e.g., time slice) and at the end of the time slice, preempts the process and schedules another one for the next time slice. The preempted process from the previous time slice is rescheduled for execution at a later time slice.

One scheme for enabling and facilitating interprocess communication and allowing use of sophisticated network protocols is sockets. The kernel has three layers that function in the context of a client-server model. These three layers include the socket layer, the protocol layer, and the device layer. The top layer, the socket layer, provides the interface between the system calls and the lower layers (protocol layer and device layer). Typically, the socket has end points that couple client processes with server processes. The socket end points can be on different machines. The middle layer, the protocol layer, provides the protocol modules for communication, such as TCP and IP. The bottom layer, the device layer, contains the device drivers that control the network devices. One example of a device driver is an Ethernet driver over an Ethernet-based network.

Processes communicate using the client-server model where the server process listens to a socket at one end point and a client process to the server process over another socket at the other end point of the two-way communication path. The kernel maintains internal connections among the three layers of each client and server and routes data from client to the server as needed.

The socket contains several system calls including a socket system call which establishes the end points of a communication path. Many processes use the socket descriptors in many system calls. The bind system call associates a name with a socket descriptor. Some other exemplary system calls include the connect system call requests that the kernel make a connection to a socket, the close system call closes sockets, the shutdown system call closes a socket connection, and the send and recv system calls transmit data over a connected socket.

Figure 3:
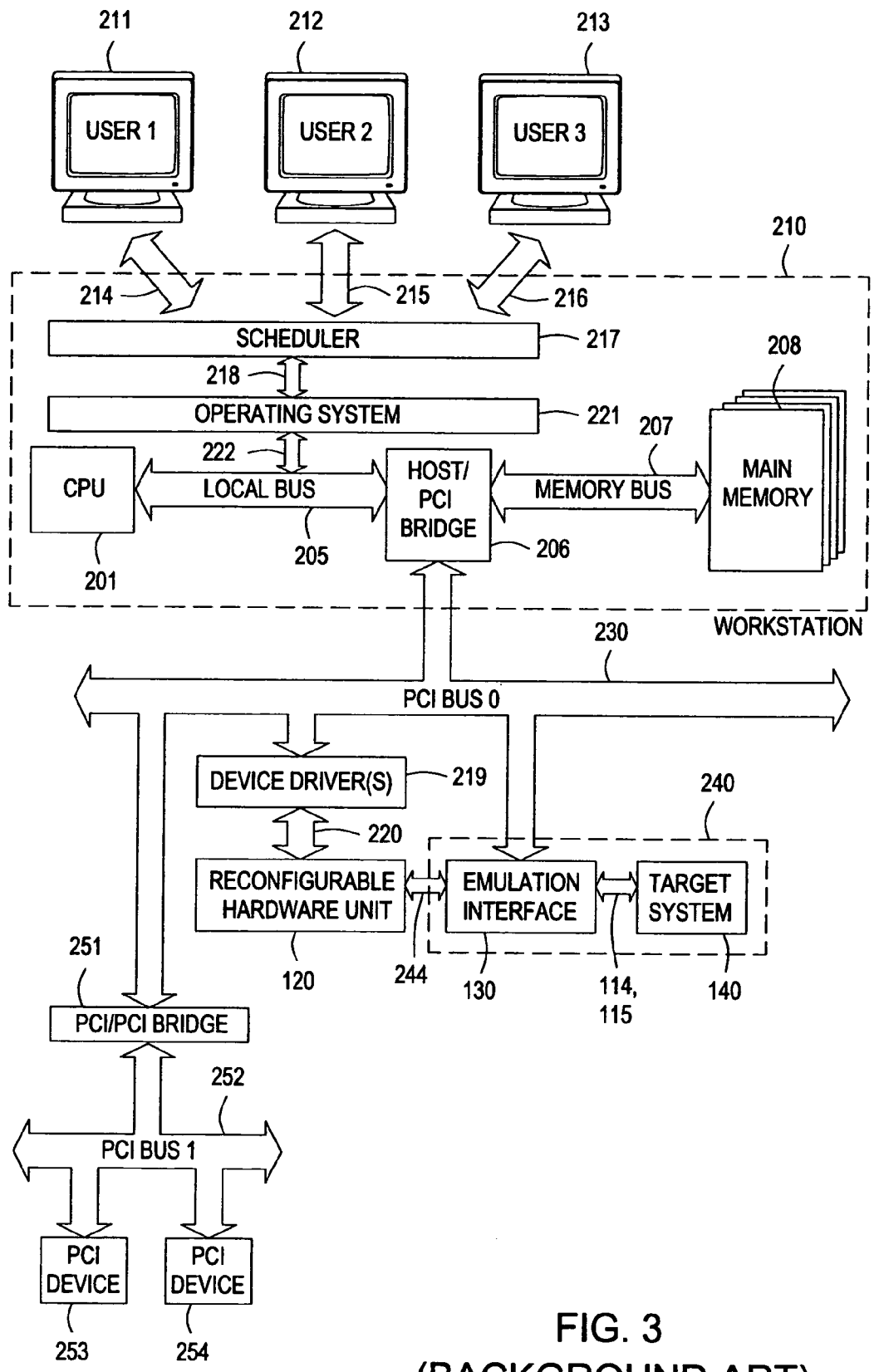
FIG. 3 shows an environment in accordance with another embodiment of the present invention in which multiple users share a single simulation/emulation system on a time-shared basis.

FIG. 3 shows another embodiment in accordance with the present invention in which multiple workstations share a single Simulation system on a time-shared basis across a network. The multiple workstations are coupled to the Simulation system via a scheduler 217. Within the computing environment of the Simulation system, a single CPU 201 is coupled to the local bus 205 in station 210. Multiple CPUs may also be provided in this system. As known to those skilled in the art, an operating system 218 is also provided and nearly all processes and applications reside on top of the operating system. For conceptual purposes the operating system 221 along with a bus 222 are shown.

In FIG. 3, workstation 210 includes those components/units found in FIG. 2 along with scheduler 217 and scheduler bus 218 coupled to the local bus 205 via the operating system 221. Scheduler 217 controls the time-shared access for the user stations 211, 212, and 213 by making socket calls to the operating system 221. Scheduler 217 is implemented mostly in software and partially in hardware.

In this figure, only three users are shown and capable of accessing the Simulation system across the network. Of course, other system configurations provide for more than three users or less than three users. Each user accesses the system via remote stations 211, 212, or 213. Remote user stations 211, 212, and 213 are coupled to the scheduler 217 via network connections 214, 215, and 216, respectively.

As known to those skilled in the art, device driver 219 is coupled between the PCI bus 230 and the reconfigurable hardware unit 120. Connection or electrically conductive path 220 are provided between the device driver 219 and the reconfigurable hardware unit 120. In this network multi-user embodiment of the present invention, the scheduler 217 interfaces with the device driver 219 via the operating system 221 to communicate and control the reconfigurable hardware unit 120 for hardware acceleration and simulation after hardware state restoration purposes.

Again, in one embodiment, the Simulation workstation 200 is a Sun Microsystems Enterprise 450 system which employs UltraSPARC II multiprocessors. Instead of the memory access via the local bus, the Sun 450 system allows the multiprocessors to access the memory via dedicated buses to the memory through a crossbar switch instead of tying up the local bus.

Figure 4:
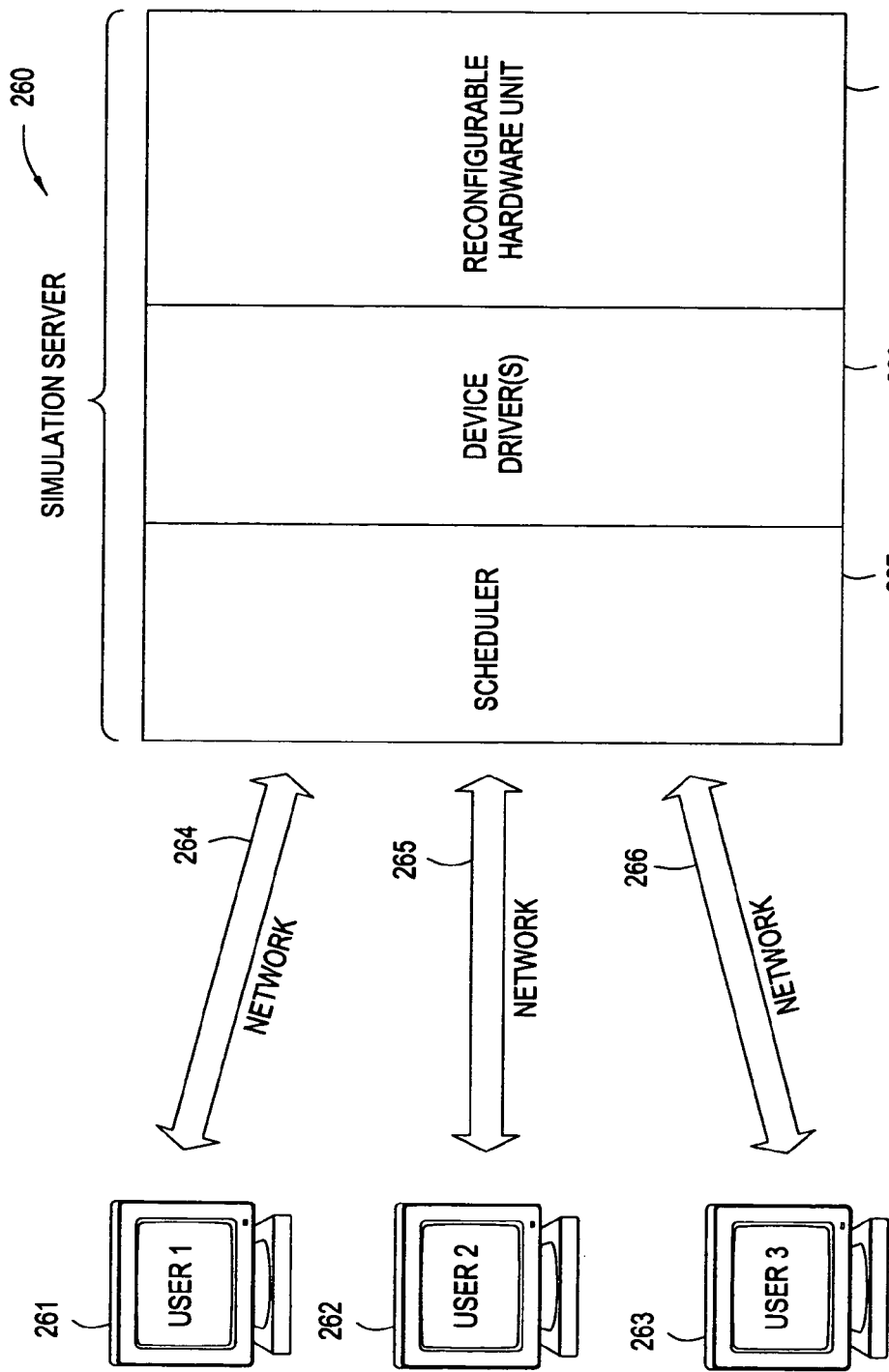
FIG. 4 shows a high level structure of the Simulation server in accordance with one embodiment of the present invention.

FIG. 4 shows a high level structure of the Simulation server in accordance with the network embodiment of the present invention. Here, the operating system is not explicitly shown but, as known to those skilled in the art, it is always present for file management and resource allocation purposes to serve the various users, processes, and devices in the Simulation computing environment. Simulation server 260 includes the scheduler 267, one or more device drivers 268, and the reconfigurable hardware unit 269. Although not expressly shown as a single integral unit in FIGS. 2 and 3, the Simulation server comprises the scheduler 217, device driver 219, and the reconfigurable hardware unit 120. Returning to FIG. 4, the Simulation server 260 is coupled to three workstations (or users) 261, 262, and 263 via network connections/paths 264, 265, and 266, respectively. As stated above, more than three or less than three workstations may be coupled to the Simulation server 260.

The scheduler in the Simulation server is based on a preemptive round robin algorithm, in accordance with one embodiment of the present invention. In essence, the round robin scheme allows several users or processes to execute sequentially to completion with a cyclic executive. Thus, each simulation job (which is associated with a workstation in a network environment or a user/process in a multiprocessing non-network environment) is assigned a priority level and a fixed time slice in which to execute.

Generally, the higher priority jobs execute first to completion. At one extreme, if different users each have different priorities, the user with the highest priority is served first until this user's job(s) is/are completed and the user with the lowest priority is served last. Here, no time slice is used because each user has a different priority and the scheduler merely serves users according to priority. This scenario is analogous to having only one user accessing the Simulation system until completion.

At the other extreme, the different users have equal priority. Thus, the time slice concept with a first-in first-out (FIFO) queue are employed. Among equal priority jobs, each job executes until it completes or the fixed time slice expires, whichever comes first. If the job does not execute to completion during its time slice, the simulation image associated with whatever tasks it has completed must be saved for later restoration and execution. This job is then placed at the end of the queue. The saved simulation image, if any, for the next job is then restored and executed in the next time slice.

A higher priority job can preempt a lower priority job. In other words, jobs of equal priority run in round robin fashion until they execute through the time slices to completion. Thereafter, jobs of lower priority run in round robin fashion. If a job of higher priority is inserted in the queue while a lower priority job is running, the higher priority job will preempt the lower priority job until the higher priority job executes to completion. Thus, jobs of higher priority run to completion before jobs of lower priority begin execution. If the lower priority job has already begun execution, the lower priority job will not be further executed to completion until the higher priority job executes to completion.

In one embodiment, the UNIX operating system provides the basic and foundational preemptive round robin scheduling algorithm. The Simulation server's scheduling algorithm in accordance with one embodiment of the present invention works in conjunction with the operating system's scheduling algorithm. In UNIX-based systems, the preemptive nature of the scheduling algorithm provides the operating system to preempt user-defined schedules. To enable the time-sharing scheme, the Simulation scheduler uses a preemptive multiple priority round robin algorithm on top the operating system's own scheduling algorithm.

Figure 12:
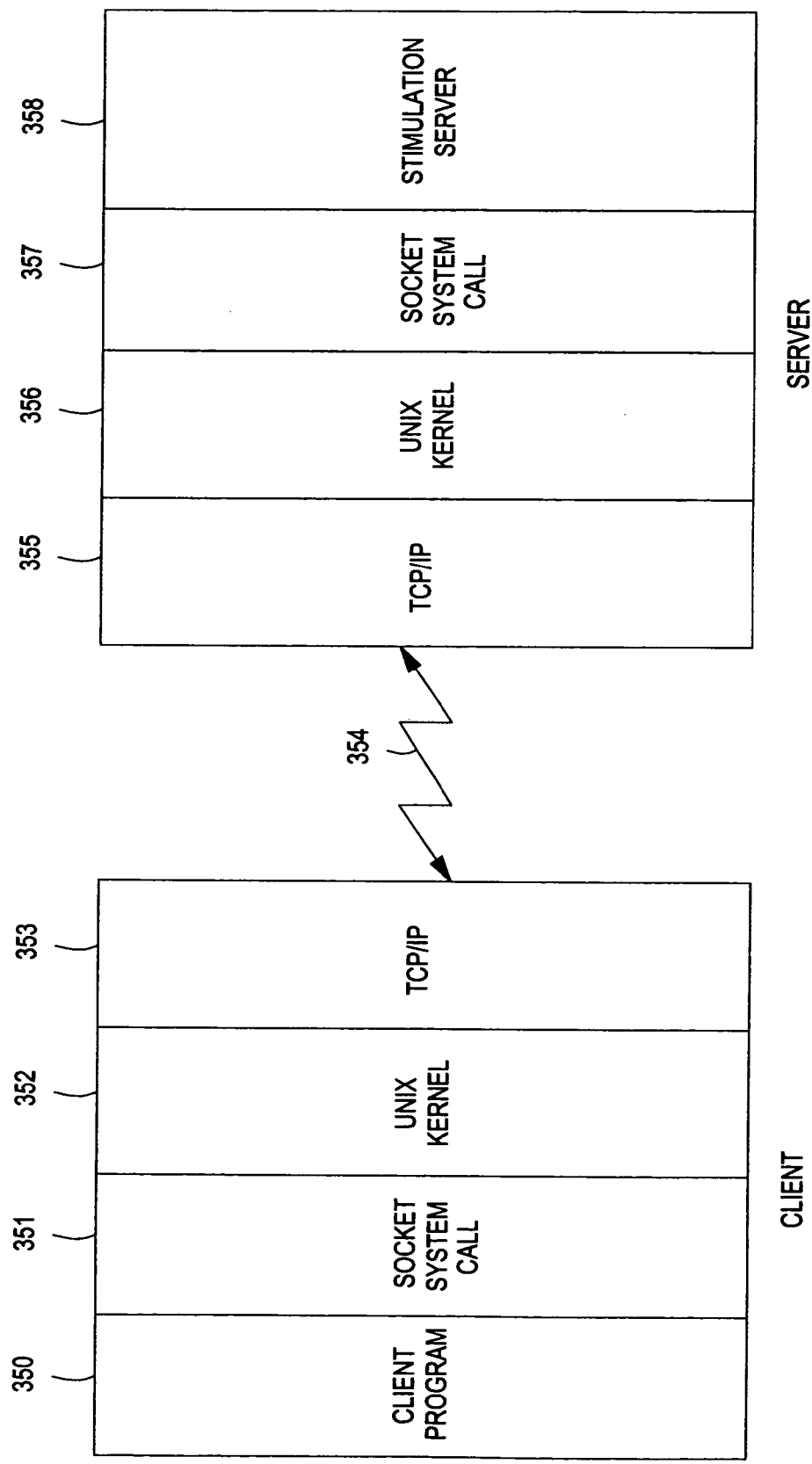
FIG. 12 shows an overview of the client-server model of the Simulation server in accordance with one embodiment of the present invention.

The relationship between the multiple users and the Simulation server in accordance with one embodiment of the present invention follows a client-server model, where the multiple users are clients and the Simulation server is the server. Communication between the user clients and the server occurs via socket calls. Referring briefly to FIG. 12, the client includes client program 350, a socket system call component 351, UNIX kernel 352, and a TCP/IP protocol component 353. The server includes a TCP/IP protocol component 355, a UNIX kernel 356, socket system call component 357, and the Simulation server 358. Multiple clients may request simulation jobs to be simulated in the server through UNIX socket calls from the client application program. The client is coupled to the server via a communication link 354.

In one embodiment, a typical sequence of events includes multiple clients sending requests to the server via the UNIX socket protocol. For each request, the server acknowledges the requests as to whether the command was successfully executed. For the request of server queue status, however, the server replies with the current queue state so that it can be properly displayed to the user. Table A below lists the relevant socket commands from the client:

TABLE A

| Client Socket Commands | |
|---|---|
| Commands | Description |
| 0 | Start simulation <design> |
| 1 | Pause simulation <design> |
| 2 | Exit simulation <design> |
| 3 | Re-assign priority to simulation session |
| 4 | Save design simulation state |
| 5 | Queue status |

For each socket call, each command encoded in integers may be followed with additional parameters such as <design> which represents the design name. Response from the Simulation server will be "0" if the command is executed successfully or a "1" if the command failed. For command "5" which requests queue status, one embodiment of the command's return response is ASCII text terminated by a "\0" character for display onto the user's screen. With these system socket calls, the appropriate communication protocol signals are transmitted to and received from the reconfigurable hardware unit via device drivers.

Figure 5:
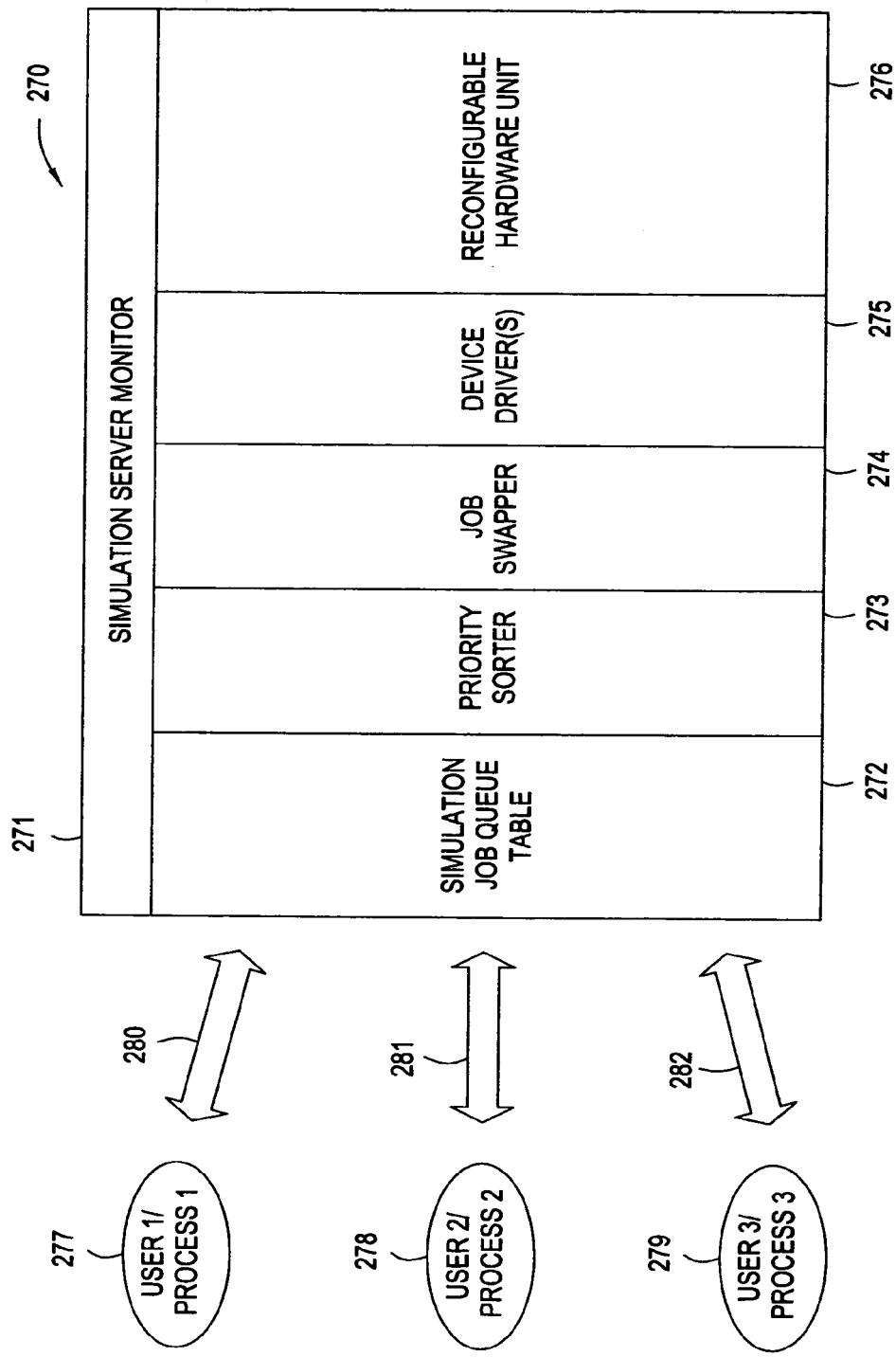
FIG. 5 shows the architecture of the Simulation server in accordance with one embodiment of the present invention.

FIG. 5 shows one embodiment of the architecture of the Simulation server in accordance with the present invention. As explained above, multiple users or multiple processes may be served by the single Simulation server for simulation and hardware acceleration of the users' designs in a time-shared manner. Thus, user/process 277, 278, and 279 are coupled to the Simulation server 270 via inter-process communication paths 280, 281, and 282, respectively. The inter-process communication paths 280, 281, and 282 may reside in the same workstation for multiprocessor configuration and operation, or in the network for multiple workstations. Each simulation session contains software simulation states along with hardware states for communication with the reconfigurable hardware unit. Inter-process communication among the software sessions is performed using UNIX socket or system calls which provide the capability to have the simulation session reside on the same workstation where the Simulator plug-in card is installed or on a separate workstation connected via a TCP/IP network. Communication with the Simulation server will be initiated automatically.

In FIG. 5, Simulation server 270 includes the server monitor 271, a simulation job queue table 272, a priority sorter 273, a job swapper 274, device driver(s) 275, and the reconfigurable hardware unit 276. The simulation job queue table 272, priority sorter 273, and job swapper 274 make up the scheduler 267 shown in FIG. 4.

The server monitor 271 provides user interface functions for the administrator of the system. The user can monitor the status of the Simulation server state by commanding the system to display simulation jobs in the queue, scheduling priority, usage history, and simulation job swapping efficiency. Other utility functions include editing job priority, deleting simulation jobs, and resetting the simulation server state.

The simulation job queue table 272 keeps a list of all outstanding simulation requests in the queue which was inserted by the scheduler. The table entries include job number, software simulation process number, software simulation image, hardware simulation image file, design configuration file, priority number, hardware size, software size, cumulative time of the simulation run, and owner identification. The job queue is implemented using a first-in first-out (FIFO) queue. Thus, when a new job is requested, it is placed at the end of the queue.

The priority sorter 273 decides which simulation job in the queue to execute. In one embodiment, the simulation job priority scheme is user definable (i.e., controllable and definable by the system administrator) to control which simulation process has priority for current execution. In one embodiment, the priority levels are fixed based on the urgency of specific processes or importance of specific users. In another embodiment, the priority levels are dynamic and can change during the course of the simulation. In the preferred embodiment, priority is based on the user ID. Typically, one user will have a high priority and all other users will have lower but equal priority.

Priority levels are settable by the system administrator. Simulator server obtains all user information from the UNIX facility, typically found in the UNIX user file called "/etc/passwd". Adding new users is consistent with the process of adding new users within the UNIX system. After all users are defined, the Simulator server monitor can be used to adjust priority levels for the users.

The job swapper 274 temporarily replaces one simulation job associated with one process or one workstation for another simulation job associated with another process or workstation based on the priority determination programmed for the scheduler. If multiple users are simulating the same design, the job swapper swaps in only the stored simulation state for the simulation session. However, if multiple users are simulating multiple designs, the job swapper loads in the design for hardware configuration before swapping in the simulation state. In one embodiment, the job swapping mechanism enhances the performance of the time-sharing embodiment of the present invention because the job swapping need only be done for reconfigurable hardware unit access. So, if one user needs software simulation for some time period, the server swaps in another job for another user so that this other user can access the reconfigurable hardware unit for hardware acceleration. The frequency of the job swapping can be user adjustable and programmable. The device driver also communicates with the reconfigurable hardware unit to swap jobs.

Figure 6:
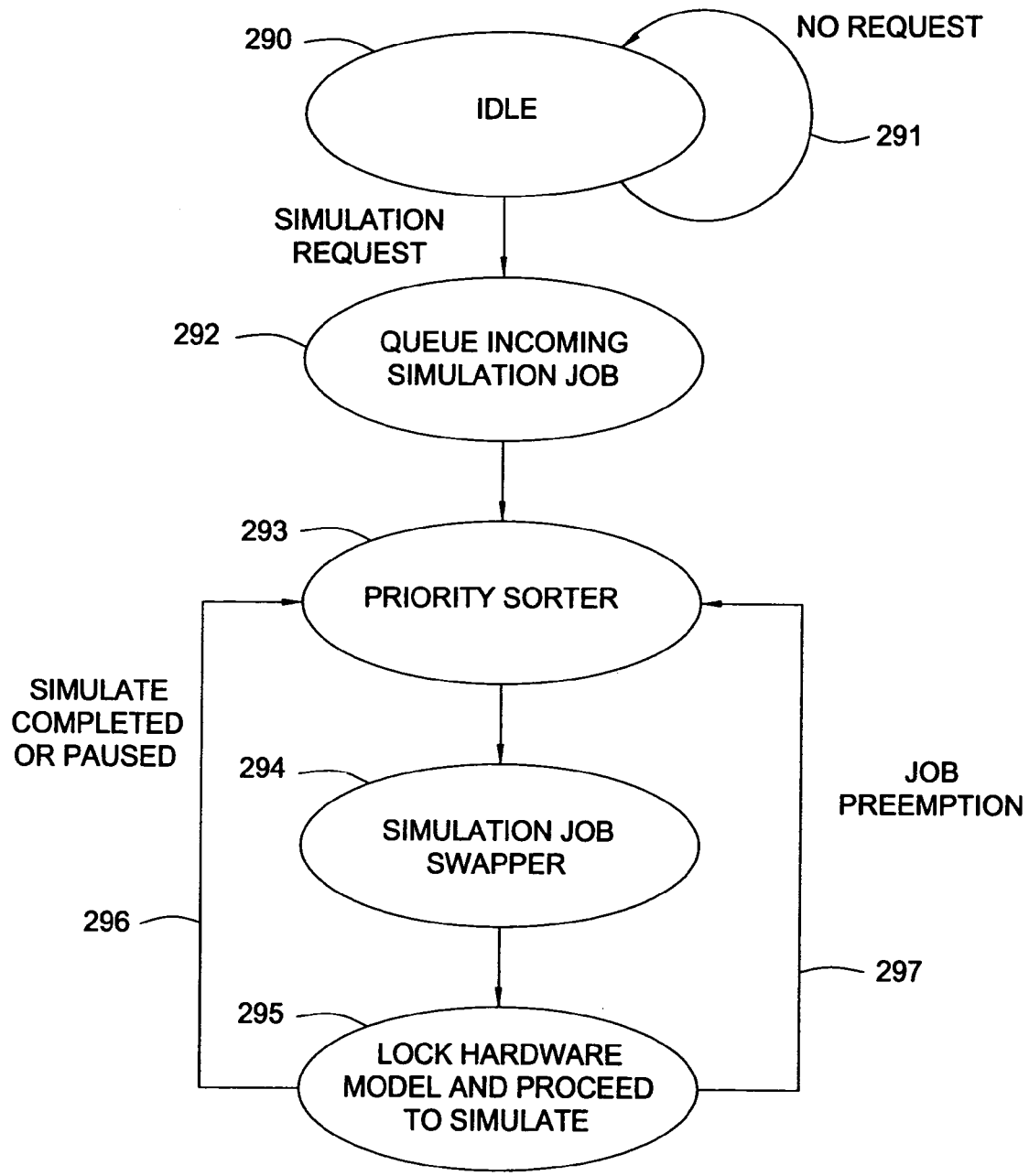
FIG. 6 shows a flow diagram of the Simulation server.

The operation of the Simulation server will now be discussed. FIG. 6 shows a flow diagram of the Simulation server during its operation. Initially, at step 290, the system is idle. When the system is idle in step 290, the Simulation server is not necessarily inactive or that a simulation task is not running. Indeed, idleness may mean one of several things: (1) no simulation is running; (2) only one user/workstation is active in a single processor environment so that time-sharing is not required; or (3) only one user/workstation in a multiprocessing environment is active but only one process is running. Thus, conditions 2 and 3 above indicate that the Simulation server has only one job to process so that queuing jobs, determining priorities, and swapping jobs are not necessary and essentially, the Simulation server is idle because it receives no requests (event 291) from other workstations or processes.

When a simulation request occurs due to one or more request signals from a workstation in a multi-user environment or from a microprocessor in a multiprocessor environment, the Simulation server queues the incoming simulation job or jobs at step 292. The scheduler keeps a simulation job queue table to insert all outstanding simulation requests onto its queue and list all outstanding simulation requests. For batch simulation jobs, the scheduler in the server queues all the incoming simulation requests and automatically processes the tasks without human intervention.

The Simulation server then sorts the queued jobs to determine priority at step 293. This step is particularly important for multiple jobs where the server has to prioritize among them to provide access to the reconfigurable hardware unit. The priority sorter decides which simulation job in the queue to execute. In one embodiment, the simulation job priority scheme is user definable (i.e., controllable and definable by the system administrator) to control which simulation process has priority for current execution if a resource contention exists.

After priority sorting at step 293, the server then swaps simulation jobs, if necessary, at step 294. This step temporarily replaces one simulation job associated with one process or one workstation for another simulation job associated with another process or workstation based on the priority determination programmed for the scheduler in the server. If multiple users are simulating the same design, the job swapper swaps in only the stored simulation state for the simulation session. However, if multiple users are simulating multiple designs, the job swapper loads in the design first before swapping in the simulation state. Here, the device driver also communicates with the reconfigurable hardware unit to swap jobs.

In one embodiment, the job swapping mechanism enhances the performance of the time-sharing embodiment of the present invention because the job swapping need only be done for reconfigurable hardware unit access. So, if one user needs software simulation for some time period, the server swaps in another job for another user so that this other user can access the reconfigurable hardware unit for hardware acceleration. For example, assume that two users, user 1 and user 2, are coupled to the Simulation server for access to the reconfigurable hardware unit. At one time, user 1 has access to the system so that debugging can be performed for his/her user design. If user 1 is debugging in software mode only, the server can release the reconfigurable hardware unit so that user 2 can access it. The server swaps in the job for user 2 and user 2 can then either software simulate or hardware accelerate the model. Depending on the priorities between user 1 and user 2, user 2 can continue accessing the reconfigurable hardware unit for some predetermined time or, if user 1 needs the reconfigurable hardware unit for acceleration, the server can preempt the job for user 2 so that the job for user 1 can be swapped in for hardware acceleration using the reconfigurable hardware unit. The predetermined time refers to the pre-emption of simulator jobs based on multiple requests of the same priority. In one embodiment, the default time is 5 minutes although this time is user settable. This 5 minute setting represents one form of a time-out timer. The Simulation system of the present invention uses the time-out timer to stop the execution of the current simulation job because it is excessively time consuming and the system decides that other pending jobs of equal priority should gain access to the reconfigurable hardware model.

Upon the completion of the job swapping step in step 294, the device driver in the server locks the reconfigurable hardware unit so that only the currently scheduled user or process can simulate and use the hardware model. The locking and simulation step occurs at step 295.

At the occurrence of either the completion of simulation or a pause in the currently simulating session at event 296, the server returns to the priority sorter step 293 to determine priority of pending simulation jobs and later swap simulation jobs if necessary. Similarly, the server may preempt the running of the currently active simulation job at event 297 to return the server to the priority sorter state 293. The preemption occurs only under certain conditions. One such condition is when a higher priority task or job is pending. Another such condition is when the system is currently running a computationally intensive simulation task, in which case the scheduler can be programmed to preempt the currently running job to schedule a task or job with equal priority by utilizing a time-out timer. In one embodiment, the time-out timer is set at 5 minutes and if the current job executes for 5 minutes, the system preempts the current job and swaps in the pending job even though it is at the same priority level.

Figure 7:
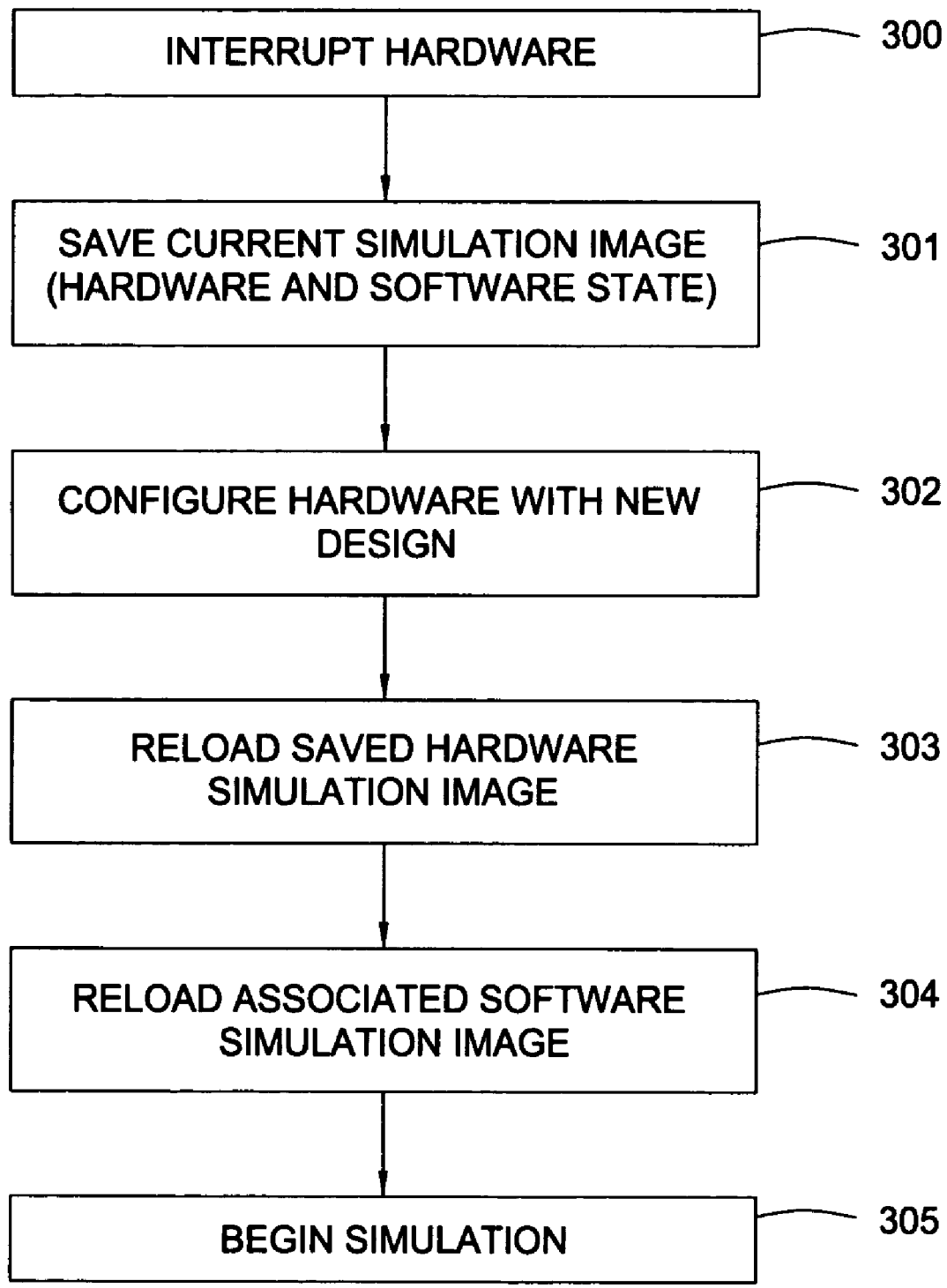
FIG. 7 shows a flow diagram of the job swapping process.

FIG. 7 shows a flow diagram of the job swapping process. The job swapping function is performed in step 294 of FIG. 6 and is shown in the Simulation server hardware as job swapper 274 in FIG. 5. In FIG. 7, when a simulation job needs to be swapped with another simulation job, the job swapper sends an interrupt to the reconfigurable hardware unit at step 300. If the reconfigurable hardware unit is not currently running any jobs (i.e., the system is idle or the user is operating in software simulation mode only without any hardware acceleration intervention), the interrupt immediately prepares the reconfigurable hardware unit for job swapping. However, if the reconfigurable hardware unit is currently running a job and in the midst of executing an instruction or processing data, the interrupt signal is recognized but the reconfigurable unit continues to execute the currently pending instruction and process the data for the current job. If the reconfigurable hardware unit receives the interrupt signal while the current simulation job is not in the middle of executing an instruction or processing data, then the interrupt signal essentially terminates the operation of the reconfigurable hardware unit immediately.

At step 301, the Simulation system saves the current simulation image (i.e., hardware and software states). By saving this image, users can later restore the simulation run without re-running the whole simulation up to that saved point.

At step 302, the Simulation system configures the reconfigurable hardware unit with the new user design. This configuration step is only necessary if the new job is associated with a different user design than the one already configured and loaded in the reconfigurable hardware unit and whose execution has just been interrupted. After configuration, the saved hardware simulation image is reloaded at step 303 and the saved software simulation image is reloaded at step 304. If the new simulation job is associated with the same design, then no additional configuration is needed. For the same design, the Simulation system loads the desired hardware simulation image associated with the new simulation job for that same design at step 303 because the simulation image for the new job is probably different from the simulation image for the just interrupted job. The details of the configuration step are provided herein in this patent specification. Thereafter, the associated software simulation image is reloaded at step 304. After reloading of the hardware and software simulation images, the simulation can begin at step 305 for this new job, while the previous interrupted job can only proceed in software simulation mode only because it has no access to the reconfigurable hardware unit for the moment.

Figure 8:
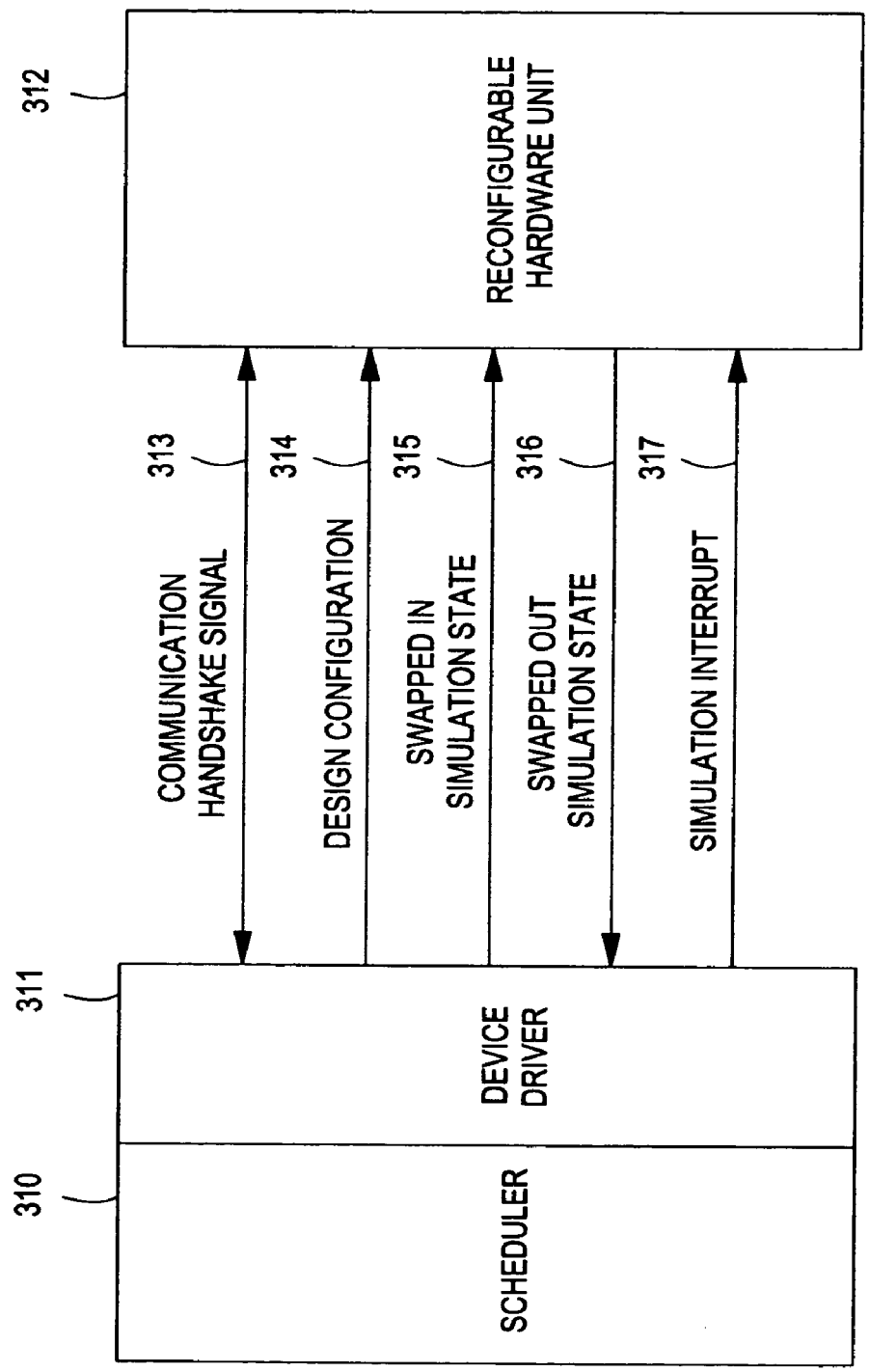
FIG. 8 shows the signals between the device driver and the reconfigurable hardware unit.

FIG. 8 shows the signals between the device driver and the reconfigurable hardware unit. The device driver 311 provides the interface between the scheduler 310 and the reconfigurable hardware unit 312. The device driver 311 also provides the interface between the entire computing environment (i.e., workstation(s), PCI bus, PCI devices) and the reconfigurable hardware unit 312 as shown in FIGS. 2 and 3, but FIG. 8 shows the Simulation server portion only. The signals between the device driver and the reconfigurable hardware unit includes the bi-directional communication handshake signals, the unidirectional design configuration information from the computing environment via the scheduler to the reconfigurable hardware unit, the swapped in simulation state information, the swapped out simulation state information, and the interrupt signal from the device driver to the reconfigurable hardware unit so that the simulation jobs can be swapped.

Line 313 carries the bi-directional communication handshake signals. These signals and the handshake protocol will be discussed further with respect to FIGS. 10 and 11.

Line 314 carries the unidirectional design configuration information from the computing environment via the scheduler 310 to the reconfigurable hardware unit 312. Initial configuration information can be transmitted to the reconfigurable hardware unit 312 for modeling purposes on this line 314. Additionally, when users are modeling and simulating different user designs, the configuration information must be sent to the reconfigurable hardware unit 312 during a time slice. When different users are modeling the same user design, no new design configuration is necessary; rather, different simulation hardware states associated with the same design may need to be transmitted to the reconfigurable hardware unit 312 for different simulation runs.

Line 315 carries the swapped in simulation state information to the reconfigurable hardware unit 312. Line 316 carries the swapped out simulation state information from the reconfigurable hardware unit to the computing environment (i.e., usually memory). The swapped in simulation state information includes previously saved hardware model state information and the hardware memory state that the reconfigurable hardware unit 312 needs to accelerate. The swapped in state information is sent at the beginning of a time slice so that the scheduled current user can access the reconfigurable hardware unit 312 for acceleration. The swapped out state information includes hardware model and memory state information that must be saved in memory at the end of a time slice upon the reconfigurable hardware unit 312 receiving an interrupt signal to move on to the next time slice associated with a different user/process. The saving of the state information allows the current user/process to restore this state at a later time, such as at the next time slice that is assigned to this current user/process.

Line 317 sends the interrupt signal from the device driver 311 to the reconfigurable hardware unit so that the simulation jobs can be swapped. This interrupt signal is sent between time slices to swap out the current simulation job in the current time slice and swap in the new simulation job for the next time slice.

Figure 10:
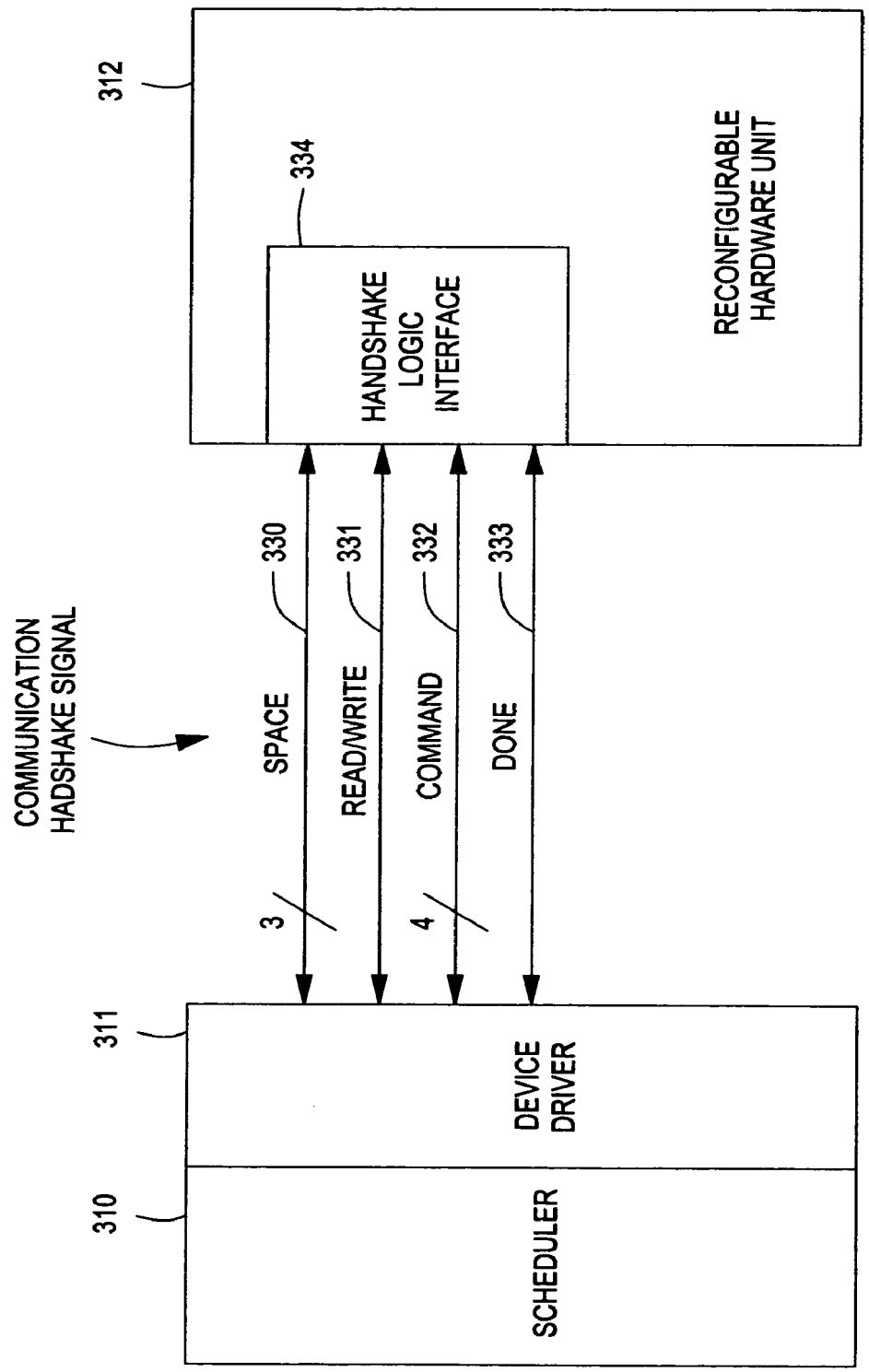
FIG. 10 shows the communication handshake signals between the device driver and the reconfigurable hardware unit.
Figure 11:
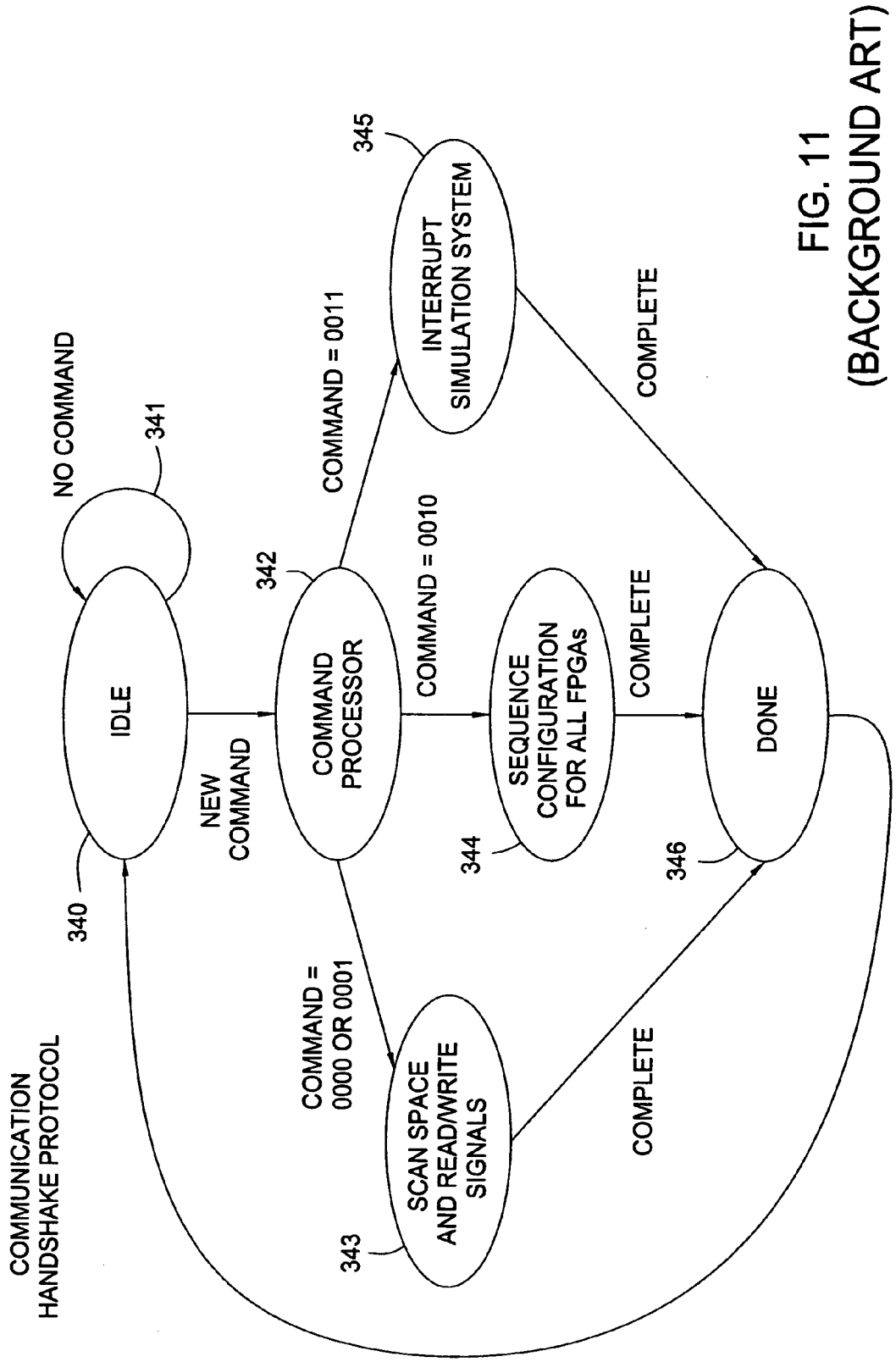
FIG. 11 shows the state diagram of the communication handshake protocol.

The communication handshake protocol in accordance with one embodiment of the present invention will now be discussed with reference to FIGS. 10 and 11. FIG. 10 shows the communication handshake signals between the device driver and the reconfigurable hardware unit via a handshake logic interface. FIG. 11 shows a state diagram of the communication protocol. FIG. 8 shows the communication handshake signals on line 313. FIG. 10 shows a detailed view of the communication handshake signals between the device driver 311 and the reconfigurable hardware unit 312.

In FIG. 10, a handshake logic interface 334 is provided in the reconfigurable hardware unit 312. Alternatively, the handshake logic interface 334 can be installed external to the reconfigurable hardware unit 312. Four sets of signals are provided between the device driver 311 and the handshake logic interface 334. These signals are the 3-bit SPACE signal on line 330, a single-bit read/write signal on line 331, a 4-bit COMMAND signal on line 332, and a single bit DONE signal on line 333. The handshake logic interface includes logic circuitry that processes these signals to place the reconfigurable hardware unit in the proper mode for the various operation that need to be performed. The interface is coupled to the CTRL_FPGA unit (or FPGA I/O controller).

For the 3-bit SPACE signal, the data transfers between the Simulation system's computing environment over the PCI bus and the reconfigurable hardware unit are designated for certain I/O address spaces in the software/hardware boundary—REG (register), CLK (software clock), S2H (software to hardware), and H2S (hardware to software). As explained above, the Simulation system maps the hardware model into four address spaces in main memory according to different component types and control functions: REG space is designated for the register components; CLK space is designated for the software clocks; S2H space is designated for the output of the software test-bench components to the hardware model; and H2S space is designated for the output of the hardware model to the software test-bench components. These dedicated I/O buffer spaces are mapped to the kernel's main memory space during system initialization time.

The following Table B provides a description of each of the SPACE signals

TABLE B

SPACE Signal

| SPACE | DESCRIPTION |
|---|---|
| 000 | Global (or CLK) space and software to hardware (DMA wr) |
| 001 | Register write (DMA wr) |
| 010 | Hardware to software (DMA rd) |
| 011 | Register Read (DMA rd) |
| 100 | SRAM Write (DMA wr) |
| 101 | SRAM Read (DMA rd) |
| 110 | Unused |
| 111 | Unused |

The read/write signal on line 1231 indicates whether the data transfer is a read or a write. The DONE signal on line 1233 indicates the completion of a DMA data transfer period.

The 4-bit COMMAND indicates whether the data transfer operation should be a write, read, configure new user design into the reconfigurable hardware unit, or interrupt the simulation. As shown in Table C below, the COMMAND protocol is as follows:

TABLE C

COMMAND Signal

| COMMAND | DESCRIPTION |
|---|---|
| 0000 | Write into designated space |
| 0001 | Read from designated space |
| 0010 | Configure FPGA design |
| 0011 | Interrupt simulation |
| 0100 | Unused |

The communication handshake protocol will now be discussed with reference to the state diagram on FIG. 11. At state 340, the Simulation system at the device driver is idle. As long as no new command is presented, the system remains idle as indicated by path 341. When a new command is presented, the command processor processes the new command at state 342. In one embodiment, the command processor is the FPGA I/O controller.

If COMMAND=0000 OR COMMAND=0001, the system reads from or writes to the designated space as indicated by the SPACE index at state 343. If COMMAND=0010, the system to initially configures the FPGAs in the reconfigurable hardware unit with a user design or configures the FPGAs with a new user design at state 344. The system sequences configuration information for all the FPGAs to model the portion of the user design that can be modeled into hardware. If, however, COMMAND=0011, the system interrupts the reconfigurable hardware unit at state 345 to interrupt the Simulation system because the time slice has timed out for a new user/process to swap in a new simulation state. At the completion of these states 343, 344, or 345, the Simulation system proceeds to the DONE state 346 to generate the DONE signal, and then returns to state 340 where it is idle until a new command is presented.

Figure 9:
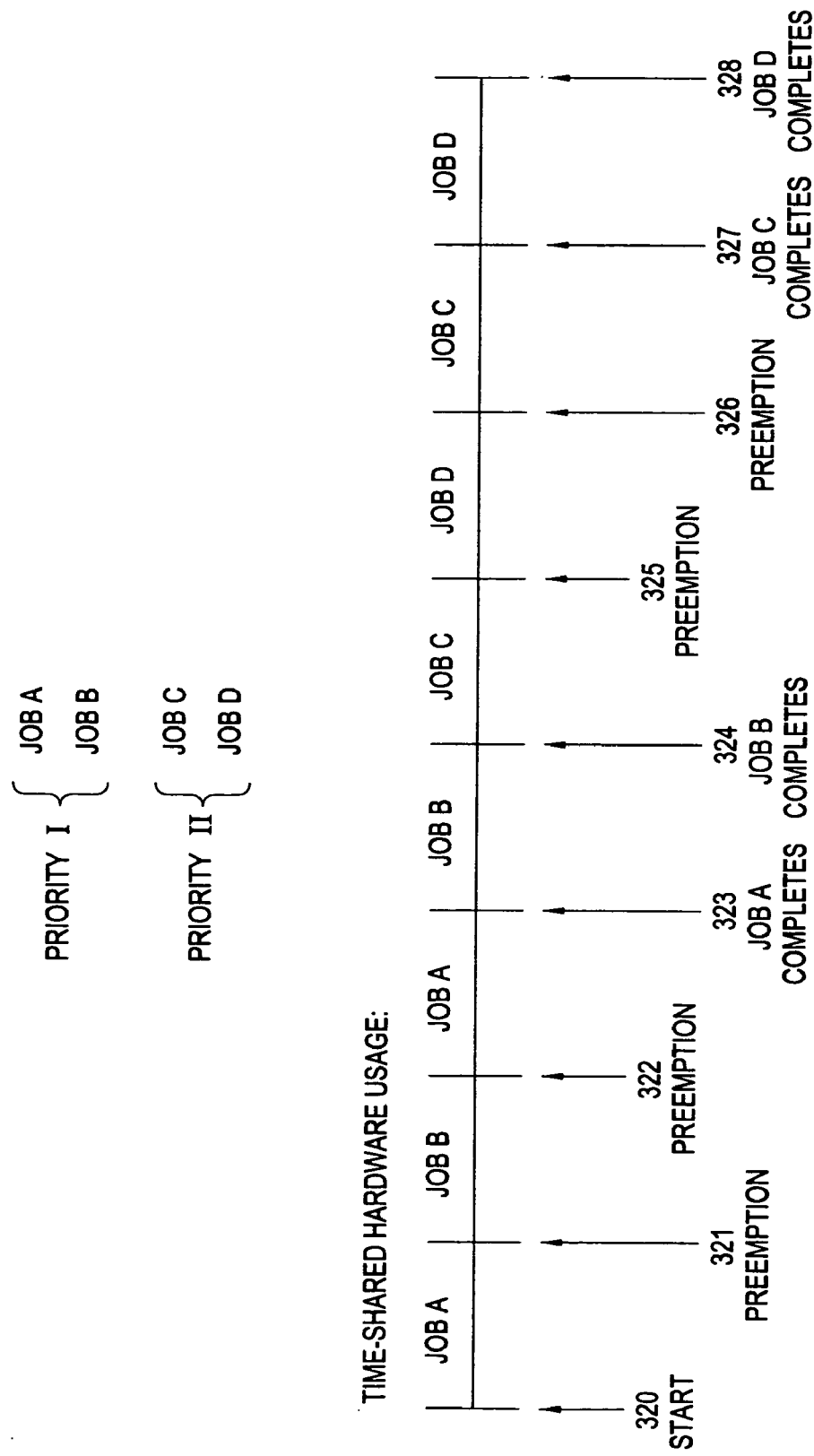
FIG. 9 illustrates the time-sharing feature of the Simulation server for handling multiple jobs with different levels of priorities.

The time-sharing feature of the Simulation server for handling multiple jobs with different levels of priorities will now be discussed. FIG. 9 illustrates one example. Four jobs (job A, job B, job C, job D) are the incoming jobs in the simulation job queue. However, the priority levels for these four jobs are different; that is, jobs A and B are assigned high priority I, whereas jobs C and D are assigned lower priority II. As shown in the time line chart of FIG. 9, the time-shared reconfigurable hardware unit usage depends on the priority levels of the queued incoming jobs. At time 320, the simulation starts with job A given access to the reconfigurable hardware unit. At time 321, job A is preempted by job B because job B has the same priority as job A and the scheduler provides equal time-shared access to the two jobs. Job B now has access to the reconfigurable hardware unit. At time 322, job A preempts job B and job A executes to completion at time 323. At time 323, job B takes over and it executes to completion to time 324. At time 324, job C, which is next in the queue but with a lower priority level than jobs A and B, now has access to the reconfigurable hardware unit for execution. At time 325, job D preempts job C for time-shared access because it has the same priority level as job C. Job D now has access until time 326 where it is preempted by job C. Job C executes to completion at time 327. Job D then takes over at time 327 and executes to completion until time 328.

Multi-User Server—Second Embodiment

In a multi-user server environment, access to server resources is one of the most important issues; that is, given that many users may want to access the same (and limited) server resources, how does the system decide which user gets access and which users do not. How does the system decide which user gets access first and which user gets access second? How does the system decide which resources get assigned to which users? Can data transfer occur concurrently among all the users once resources have been assigned to all the users? The various embodiments of the present invention answer these questions.

Figures 13, 14:
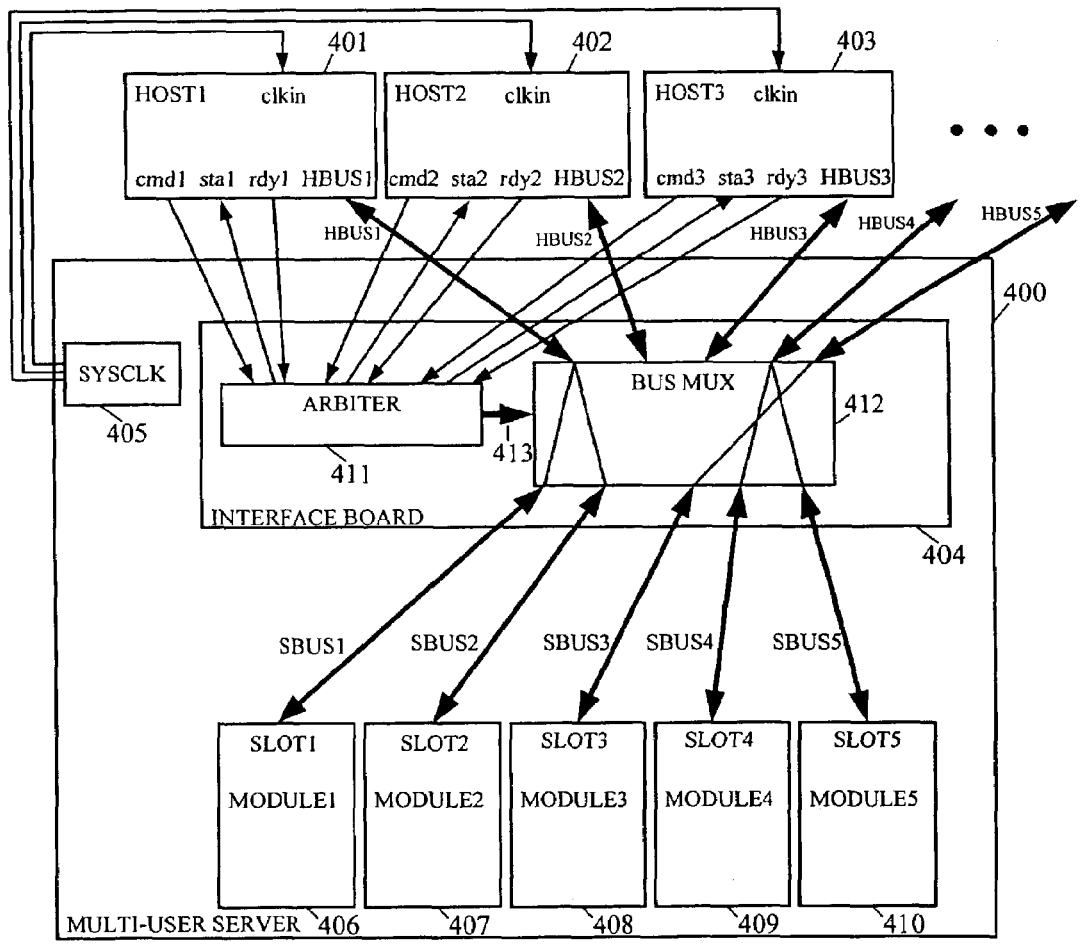
FIG. 13 shows a high level view of the multi-user server and its bus arbitration system in accordance with one embodiment of the present invention.
FIG. 14 shows a table representing the status information that the multi-user server creates, updates, and saves for all other entities in the network.

In accordance with one embodiment of the present invention as shown in FIG. 13, the intelligence to arbitrate among multiple requests lies in hardware at the server. Referring to FIG. 13, multiple hosts which represent individual users and their workstations or computer terminals are coupled to a multi-user server 400. In this figure, although only three hosts 401, 402, and 403 are shown, many more (or less) may be provided in this environment. The multi-user server 400 and the hosts 401, 402, 403 are coupled together via many control lines (command, status, ready) and host bus lines (HBUS1, HBUS2, HBUS3). The control lines (cmd, sta, rdy) are serial data lines in one embodiment. A plug-in host adapter card and appropriate software are installed in each host workstation to enable each host to communicate with the multi-user server via these control lines. Among other things, the host adapter card contains Command and Status Registers as well communication protocol functionality between the server 400 and each host. A summary of the Command and Status Registers are provided in Tables D-I.

The multi-user server 400 includes a system clock 405, an interface board 404, and a plurality of slot modules represented by 406, 407, 408, 409, and 410. Although only five slot modules (406, 407, 408, 409, and 410) are shown in this figure for exemplary purposes, many more (or less) can be provided.

The system clock 405 provides a clock reference for the host workstations (e.g., 401, 402, 403) and the multi-user server 400 to synchronize their interactions.

The interface board 404 includes an arbiter 411 and a bus mux 412. The control lines (cmd, sta, rdy) between the host workstations (e.g., 401, 402, 403) and the multi-user server 400 are coupled between the hosts and the arbiter 411. The data, however, passed between the hosts and the multi-user server 400 go through the bus mux 412. The arbiter 411 controls the operation of the bus mux 412 through line 413.

The multi-user server 400 also includes slot modules 406-410, in accordance with one embodiment of the present invention. These slot modules are the FPGA chips on several boards that comprise the reconfigurable hardware unit or accelerator (unit 120 in FIGS. 1 and 2) which models the hardware portion of the user design. In other words, while the software model of the user circuit lies in the host (e.g., 401, 402, 403), the hardware model of the user design lies in the slot modules 406-410. The number of slot modules (and hence, the number of FPGA chips and boards) depend on the size of the user circuit design that is under test; that is, the larger and more sophisticated the circuit design, the more FPGA chips and boards (and hence, slot modules) are needed in the system.

In accordance with one embodiment of the present invention, the reconfigurable hardware accelerator/emulator represented by 406-410 can model only one hardware model (and hence, to only one user workstation) at a time. In another embodiment, the server 400 can allocate individual slot modules to individual users as needed. In other words, the server 400 can allocate Slot1 (406) to Host1 (workstation 401) while Slot2 and Slot3 are allocated to Host2 (workstation 402) for concurrent use.

With this system, individual host workstations can access a single reconfigurable simulation accelerator/emulator (i.e., 406-410) for debug and testing their respective designs. Thus, a user with one user circuit design can test his design using the software model in his workstation 401 while another user in workstation 402 can test his design using the hardware model in the multi-user server 400. At another time, the user in workstation 401 can access the configure his model in the slot modules of the reconfigurable hardware model in the server 400, while another user in workstation 402 can work with the software model only.

How does the multi-user server 400, and in particular the arbiter 411, keep track of which host is assigned to which slot modules?

Refer to the table in FIG. 14. An explanation of this table will be provided along with the control lines (cmd, sta, rdy) between the host(s) and the arbiter 411.

Assuming five host workstations (Host1 to Host5) and five slot modules (Slot1 to Slot5), a table that maps hosts to slots are provided. Whenever the server allocates (or has allocated) one or more slots to a host, a logic "1" is indicated in the appropriate table entry. When no slot has been allocated, the table is filled with logic "0" s. To make sure every entity has the most current up-to-date status of the slot-to-host allocations, a copy of this table is provided to each host, the arbiter 411, and the bus mux 412.

The control lines and their respective functionality (cmd, sta, rdy) will now be discussed. The command line (cmd) is a serial (and hence 1 bit) line that is used by the host to deliver a command to the multi-user server 400 via the arbiter 411. In one embodiment, the serial bit stream is 32 bits long, with the actual command in bits [22:0] and bits [31:23] reserved. In other embodiments, the bit stream is 23 bits long with no reserved bit positions. Regardless of the length of the bitstream, this embodiment uses a serial bit stream.

Each host sends commands and checks the status of the network through the Command and Status Registers in its respective host adapter card. Two types of commands are supported—Request for Status Command and Request for Slot Command. A summary of the commands are provided in Table D (below).

Before any allocation is done, each host sends a Request for Status Command via the "cmd" line. Bit positions [2:1] (or, CMD_TYPE[1:0]) is reserved for the command. "01b" refers to Request for Status. "10b" refers to Request Slot Command. By sending the Request for Status Command, the host is attempting to get its host ID and the current slot status of the reconfigurable hardware accelerator. In other words, the host is attempting to get the table like the exemplary table in FIG. 14, which provides information on which slots are available and which slots are taken. For bit positions [14:3] (or SLOT[12:1]), a Request Status Command sets these to all "0" s. At the appropriate time, this bitstream is transmitted to the arbiter 411.

TABLE D

Command Register

| Bit | Signal | Description | R/W | Value after Reset |
|---|---|---|---|---|
| 0 | 0 | | | 0 |
| 2:1 | CMD_TYPE[1:0] | 01b for Request Status Command; 10b for Request Slot Command. | W | 00b |
| 14:3 | SLOT[12:1] | For Request Status Command, set SLOT[] = 0; For Request Slot Command, set the bits for requested slots. | W | 000h |
| 15 | XMIT_CMD | If 1, bit 0-14 will be transmitted to RCC box after register wr; If 0, no transmission. | W | 0 |
| 31:16 | reserved | | | |

In response to the Request Status Command, the server sends essentially a copy of the most updated version of the Table of Slot-Allocation (like the one in FIG. 14) via the "sta" control line. Based on which table entry contains a "0" or "1," the host will know which slots are taken and which are available. The arbiter sends back the host ID in bit positions [3:0] (or HOST_ID[3:0]). These 4 bits range can range from 0001b (Host1) to 1100b (Host12). The next 12 bits [15:4] refer to the slots owned by Host1; the next 12 bits [27:16] after that refer the slots owned by Host2; and so on. For example, for Host1, if the 12 bits [15:4] contain "000000000011" then Host1 owns Slot1 and Slot2.

In response to the Request Status Command, if no response (i.e., Status Registers are all "0") is delivered from the server 400 to the relevant host due to collision or invalid slot request, the requesting host shall resend the Request Status Command until a valid status is received by the requesting host. A summary of the status information is provided in Tables E-I (below).

TABLE E

Status Register1: reset by writing COMMAND Reg

| Bit | Signal | Description | R/W | Value after Reset |
|---|---|---|---|---|
| 3:0 | HOST_ID[3:0] | From 0001b to 1100b for host1 to host12 | R | 0h |
| 15:4 | HOST1_SLOT [12:1] | Slots owned by host1; each bit represents on slot | R | 000h |
| 27:16 | HOST2_SLOT [12:1] | Slots owned by host2; each bit represents on slot | R | 000h |
| 31:28 | HOST3_SLOT [4:1] | Slots owned by host3; each bit represents on slot | R | 0h |

TABLE F

Status Register2: reset by writing COMMAND Reg

| Bit | Signal | Description | R/W | Value after Reset |
|---|---|---|---|---|
| 7:0 | HOST3_SLOT [12:5] | Slots owned by host3; each bit represents on slot | R | 00h |
| 19:8 | HOST4_SLOT [12:1] | Slots owned by host4; each bit represents on slot | R | 000h |
| 31:20 | HOST5_SLOT [12:1] | Slots owned by host5; each bit represents on slot | R | 000h |

TABLE G

Status Register3: reset by writing COMMAND Reg

| Bit | Signal | Description | R/W | Value after Reset |
|---|---|---|---|---|
| 11:0 | HOST6_SLOT [12:1] | Slots owned by host6; each bit represents on slot | R | 000h |
| 23:12 | HOST7_SLOT [12:1] | Slots owned by host7; each bit represents on slot | R | 000h |
| 31:24 | HOST8_SLOT [8:1] | Slots owned by host8; each bit represents on slot | R | 00h |

TABLE H

Status Register4: reset by writing COMMAND Reg

| Bit | Signal | Description | R/W | Value after Reset |
|---|---|---|---|---|
| 3:0 | HOST8_SLOT [12:9] | Slots owned by host8; each bit represents on slot | R | 0h |
| 15:4 | HOST9_SLOT [12:1] | Slots owned by host9; each bit represents on slot | R | 000h |
| 27:16 | HOST10_SLOT [12:1] | Slots owned by host10; each bit represents on slot | R | 000h |
| 31:28 | HOST11_SLOT [4:1] | Slots owned by host11; each bit represents on slot | R | 0h |

TABLE I

Status Register5: bit[30:0] reset by writing COMMAND Reg

| Bit | Signal | Description | R/W | Value after Reset |
|---|---|---|---|---|
| 7:0 | HOST11_SLOT [12:5] | Slots owned by host11; each bit represents on slot | R | 00h |
| 19:8 | HOST12_SLOT [12:1] | Slots owned by host12; each bit represents on slot | R | 000h |
| 29:20 | reserved | | | |
| 30 | STATUS_DONE | Staus-receiving from the server is done | R | 0 |
| 31 | LOCK | If 1, sysclk of host adapter is locked to sysclk from the multi-user server | R | 0 |

In accordance with one embodiment of the present invention, the sequence of steps for a Request Status Command is as follows:

1. Configure Control FPGA of the host adapter card if not configured yet.
2. Check LOCK of Status Register 5. Print the error message "RCC clock is not connected" if the value is a logic "0".
3. Write COMMAND Register with 00008002h.

4. Read STATUS Register 1-5.
5. Read HOST_ID[3:0] in STATUS Register 1 and STATUS_DONE in STATUS Register 5. If HOST_ID[3:0] is not in the range 1-12, re-start at step 1. Maximum retry attempts is 10. If STATUS_NONE is 0, stop and display error message.
6. From the valid STATUS Register 1-5, get the assigned HOST_ID, and SLOT Registers for Host1-Host12.

If the host determines a slot (or several slots) whose capacity is large enough to hold the hardware model of the user's design is available, it can elect to send a Request Slot Command to the arbiter. If the host sends a Request Slot Command to the arbiter 411, bit positions [2:1] (or CMD_TYPE[1:0] is set to "10b". For bit positions [14:3] (or SLOT[12:1]), the bits are set to the identity of the requested valid slots. For example, assuming there are 12 slots, the bitstream 000001110000 for bit positions [14:3] refers to the host requesting slots 5-7. To explain, counting from the right, the first four "0"s refer to Slot1 to Slot4, the next three "1"s refer to Slot5 to Slot7, and the final five "0"s refer to Slot8 to Slot12. By designating a "1" in the corresponding bit positions, the host can identify the slot(s) that it wants to access.

When a valid Request Slot Command is accepted and the host sends a "ready" signal via the "rdy" line to the arbiter 411, the arbiter 411 and the bus mux 412 will then connect the Local Busses (HBUS's, SBUS's) between the hosts and slots according to the updated status. For example, if Host1 requests a valid command to access Slot3 and Slot5, Bus Mux 412 will connect Host1 to Slot3 and Slot5 via HBUS1, SBUS3, and SBUS5. If the "rdy" line of any host is off due to power down or disconnection, the arbiter will reset the slot allocation of the related hosts.

When the host has finished using its slots, it shall send a Request Slot Command to release the occupied slots. It does so by merely writing "0"s in those slots that it owned previously; that is, on those bit positions identifying the slots it owns and which contains a logic "1", the Request Slot Command will now replace those "1"s with "0"s. By releasing the slot(s), it/they can be reassigned by the server to other users who request it/them. Note that just because a user is performing software simulation of hardware state values obtained from its hardware model in the reconfigurable hardware unit does not mean that the user has "released" his slots. An express release command, which effectively states that the user no longer needs his assigned slots, is necessary.

The following steps are performed during the Request/Release Slots:
1. Run control sequence of Request Status
2. Prepare the COMMAND Register as follows:
   a. CMD_TYPE[1:0]=10b
   b. Get available slots from the STATUS Registers
   c. Assign the requested slots from the available slots; set bits in SLOT[12:1]
   d. Set SLOT[12:1] 000h for Release Slot
   e. Set XMIT_CMD=1
3. Write COMMAND Register
4. Read STATUS Register 5. Check if STATUS_DONE=1 and LOCK=1
   a. If LOCK=0, print error message and stop
   b. If STATUS_DONE=0, keep on checking for 1000 times. Print error message and stop if STATUS_DONE=0 still
5. Read STATUS Register 1-4
6. Check HOST_ID[3:0] in STATUS Register 1. If not match with the assigned HOST_ID from Request Status Command, re-start at step 1. Maximum retry is 10
7. Check the SLOT Register of the assigned host. It should be the same as SLOT[12:1] in COMMAND Register. If not, re-start at step 1. Maximum retry is 10.

The bus arbiter control logic inside each host, such as host 401 in FIG. 13, will now be described. Remember that the bus arbiter control logic in each host communicates with the bus arbiter 411 in the multi-user server 400 to deliver status info, slot request/release commands, and data.

Figure 15:
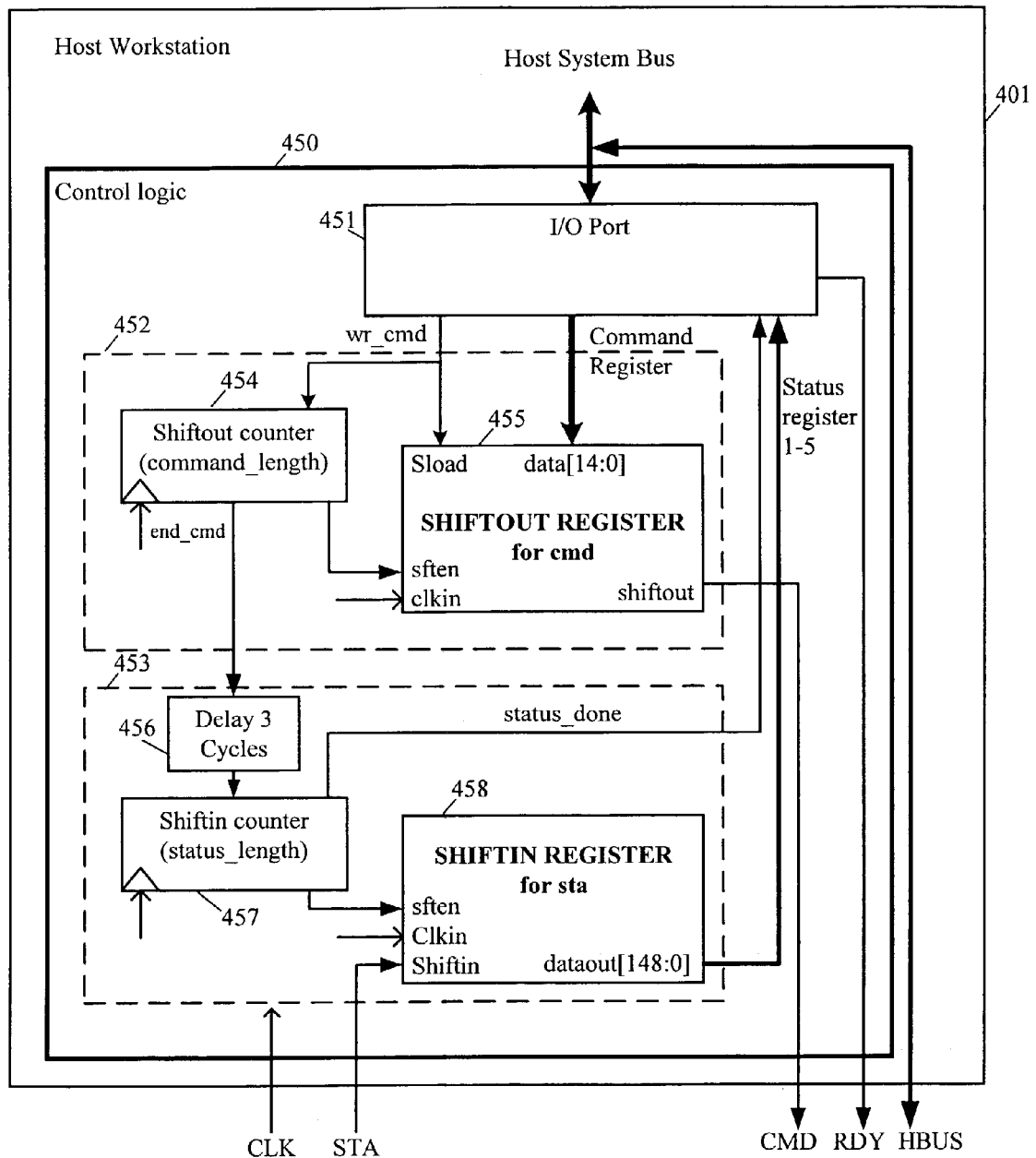
FIG. 15 shows a detailed view of the control logic in the host that interfaces with the bus arbiter in the multi-user server in accordance with one embodiment of the present invention.

Referring now to FIG. 15, each host workstation 401 contains a bus arbiter control logic 450, which is coupled to the rest of the host's components via the host system bus and its I/O port 451. In one embodiment, the control logic and the host system bus is part of a host adapter card. A PCI controller is also provided at the host system bus to provide the conversion from PCI traffic (looking toward the host) and multi-user server traffic (looking toward the control logic). As generally described in FIG. 13, the primary lines for the delivery of commands and data are CMD, RDY, STA, and the HBUS.

The control logic 450 includes a command unit 452 and a status unit 453. Note that in accordance with one embodiment of the present invention, the control logic 450 in each host requests status, request slots, release slots, and receives status information from the network. To perform these tasks, the command unit 452 includes a shiftout counter 454 and a shiftout register 455. The status unit 453 includes a delay unit 456, a shiftin counter 457, and shiftin register 458.

If the host wants to send a command, either to request status, request slots, or release slots, it does so by writing the command into the Command Register (01b for Request Status; 10b for Request Slots in CMD_TYPE[1:0], or bit positions [2:1]). This command is followed by the slot(s) information (SLOT[12:1] or bit positions [14:3]). These 15 bits (bit 0, 2 bits for the command, 12 bits for the slots) are delivered from the host to the command unit 452 in the control logic 450. In particular, these 15 bits are delivered to the shiftout register 455 via the parallel data line [14:0]. The wr_cmd line enables the shiftout counter 454 to count to 15 bits and tells the shiftout register 455 to load the 15 bits of data [14:0] from the I/O port. These 15 bits are then shifted out serially along the CMD line at the shiftout output in response to the shift enable (sften) command delivered by the shiftout counter 454. These 15 bits, as mentioned before, represent the 15 bits of the command (status request, slot request, slot release) that are delivered to the multi-user server 400 (in FIG. 13).

At the end of the 15 bits of the command, the shiftout counter 454 pulses the end_cmd to the delay unit 456 in the status unit 453. The delay unit 456 waits for 3 cycles (or however many cycles is programmed). The purpose of the delay is to wait for the multi-user server to process the command that has just been delivered by the host's control logic 450 and respond back. Typically, the multi-user server should respond by 3 cycles.

At the end of the delay, the shiftin counter 457 is enabled. The shiftin counter 457 counts for as long as the status_length of the bits representing the status of the network. In one embodiment, it is 149 bits long [148:0]. It enables the shiftin register 458 to receive the bits via the STA line serially. Controlled by the counting of the shiftin counter 457, the shiftin register 458 takes in the 149 bits of the status registers (host ID, table of hosts and assigned slots).

At the end of the count by shiftin counter 457, it delivers a status_done pulse to the I/O port 451. The I/O port 451 then takes the dataout[148:0], which represents the status table, in parallel from the shiftin register 458.

Figure 16:
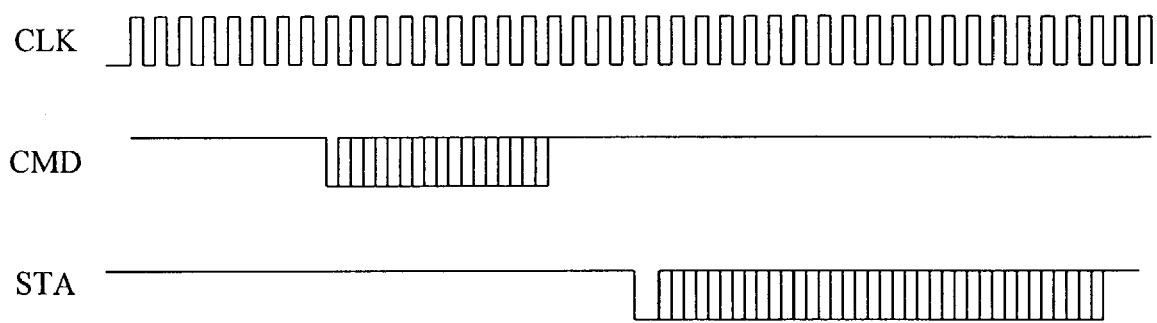
FIG. 16 shows a general timing diagram of the command and status sequences.

The timing diagram of FIG. 16 illustrates portions of this process. In synchronization with the CLK, the shiftout register 455 serially delivers the command bits [14:0] as indicated by the CMD timing pattern. After a momentary delay, the multi-user server then delivers the status information via the STA serial line as shown by the STA timing pattern.

When RDY=1, the host is active. If RDY=0, the arbiter resets the row of the host in the slot table.

Figure 17:
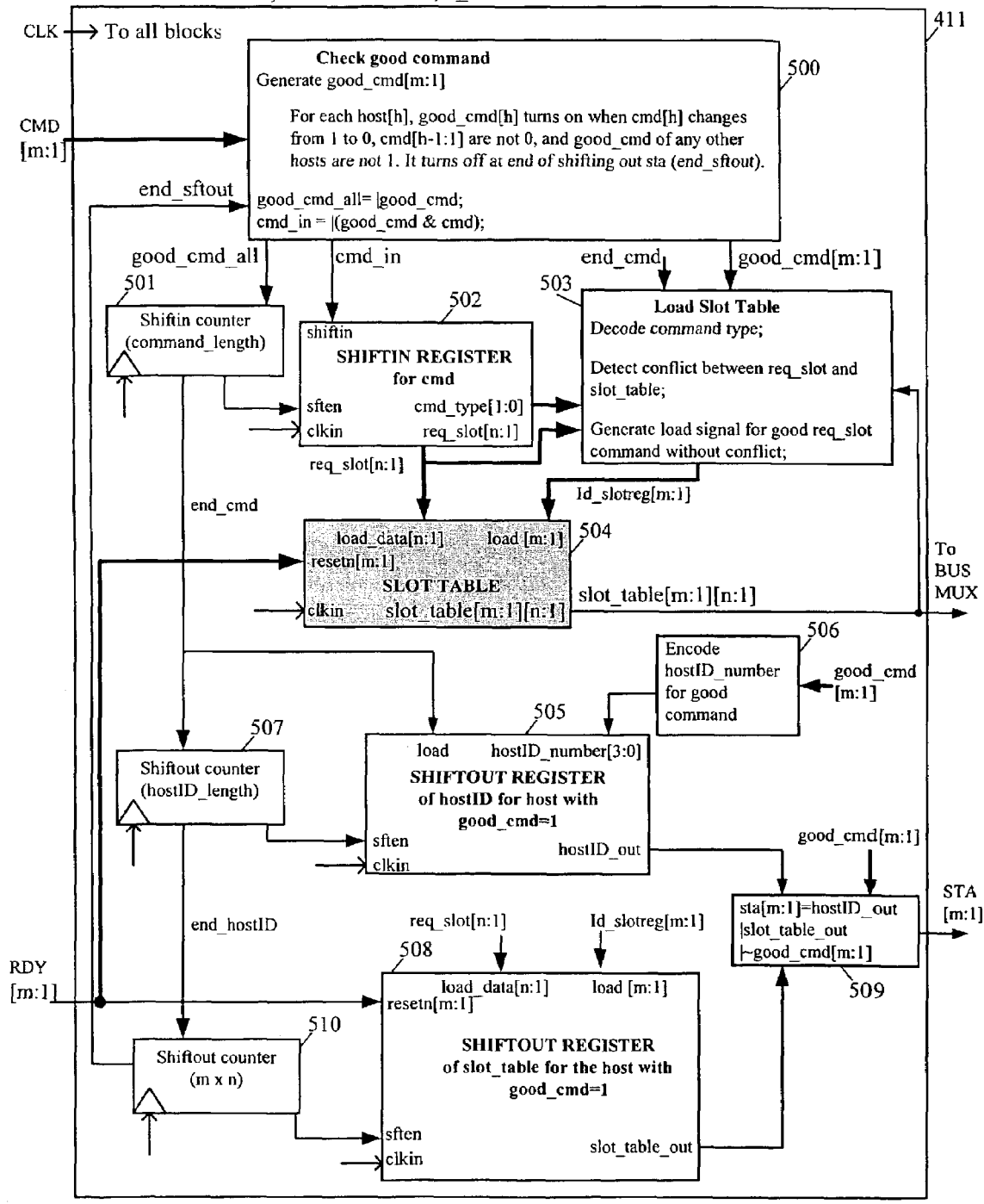
FIG. 17 shows a detailed view of the bus arbiter in the multi-user server in accordance with one embodiment of the present invention.

As mentioned above, the control logic 450 in each host communicates with the bus arbiter 411 in the multi-user server 400 (FIG. 13). The bus arbiter 411 will now be discussed with reference to FIG. 17. For the purposes of this discussion, the number of hosts is designated by "m" and the number of slots is designated by "n," where n is greater than or equal to m.

When the CMD stream of bits comes into the bus arbiter 411 of the multi-user server 400 via, it reaches the Check Good Command block 500. The purpose of this block is to generate a good_cmd[m:1] which gives the selected host access to the server. Essentially, good_cmd[m:1] for the winning host in this arbitration among hosts who want access is set to "1" when another host releases its access or no other lower number host wants access. In this embodiment, the hosts are numbered from 1 to m and arbitrarily, the lower numbered hosts are given priority over higher numbered hosts. In other words, host1 is given priority over host3 and host42 is given priority over host 58. For each host[h], good_cmd[m:1] turns on when cmd[h] changes from 1 to 0; cmd [h-1:1] are not 0; and good_cmd of any other hosts are not 1. It turns off at the end of shifting out STA (cmd_sftout).

When a good_cmd exists, good_cmd_all is set. This good_cmd_all is provided to shiftin counter 501, which shifts in the required number of bits based on the command_length. The command stream of bits is provided on cmd_in from Check Good Command block 500 to shiftin register 502, whose operation is enabled by the shiftin counter 501 via the sften signal. A good_cmd[m:1] is provided to Load Slot Table block 503 to enable its operation.

The shiftin register 502 delivers the cmd_type[1:0] (that is, whether it's a status request, slot request, or slot release) to the Load Slot Table block 503. The shiftin register 502 also delivers the requested slot information (if the command is a request slot) req_slot[n:1] to both the Load Slot Table block 503 and the Slot Table block 504.

In the Load Slot Table block 503, the command type is first decoded. It also detects any conflict between the requested slot and the slot table; that is, for example, does the host want slot 4 when another host already has been assigned slot 4? If any good req_slot command exists without conflict, then the Load Slot Table block 503 generates a load signal ld_slotreg [m:1] which is delivered to the Slot Table 504.

The Slot Table block 504 delivers the table of slot assignments (such as the table shown in FIG. 14) represented as slot_table[m:1][n:1], where [m:1] represents the rows and [n:1] represents the columns, to the bus mux 412 (FIG. 13) and back to the Load Slot Table block 503.

Back to the shiftin counter 501, when it has completed its shifting based on the command length, it generates an end_cmd pulse to shiftout counter 507 and shiftout register 505. The purpose of this section of the bus arbiter is to generate the host ID associated with the arbitration-winning host; that is, the host ID of the host with good_cmd=1. In this embodiment, the host ID length is 4 bits. The shiftout counter 507 enables the shiftout register 505 via the sften signal.

A Host ID encode block 506 receives the good_cmd[m:1] signal. Note that this good_cmd[m:1] signal will indicate which of the hosts generating the command has won the arbitration. The host ID encode block 506 encodes the winning host into 4 bits and delivers the host_ID number[3:0] to the shiftout register 505. When the shiftout register 505 receives the load signal (which is the same as the end_cmd signal from the shiftin counter 501), the host ID number has been loaded into the shiftout register 505. The shiftout counter 507 (via the sften signal) controls the shifting out of the host_ID number via the hostID_out serially port.

At the end of the count by shiftout counter 507 for the length of the host ID, it generates an end_hostID pulse to shiftout counter 510. The shiftout counter 510 counts for as long as the size of the slot table (mxn). It controls the shifting of shiftout register 508, which shifts out the slot table for the host associated with good_cmd=1.

The shiftout register 508 receives the req_slot[n:1] from the host in the CMD stream and ld_slotreg[m:1] from the Load Slot Table block 503. Controlled by the shiftout counter 510, the shiftout register 508 shifts out the slot table to STA block 509. The shiftout register 505 also shifts out the host ID to the STA block 509. The STA block also receives the good_cmd[m:1] signal. In response, the STA block 509 generates STA[m:1] and delivers it back to the winning host. This STA[m:1] indicates the current status in the slot table of the host assignment of the requested slot. The host also receives the encoded host ID. Prior to receiving its host ID, the host does not know which host it is and therefore, will not know what to look for in the slot table. When it receives the host ID, it then knows which host it is and can then check the slot table for its status.

The RDY[m:1] is provided to the Slot Table block 504 and the shiftout register 508 for reset purposes. If the RDY line of any host is off due to power down or disconnection, the arbiter will reset the slot allocation of the corresponding host.

Figure 18:
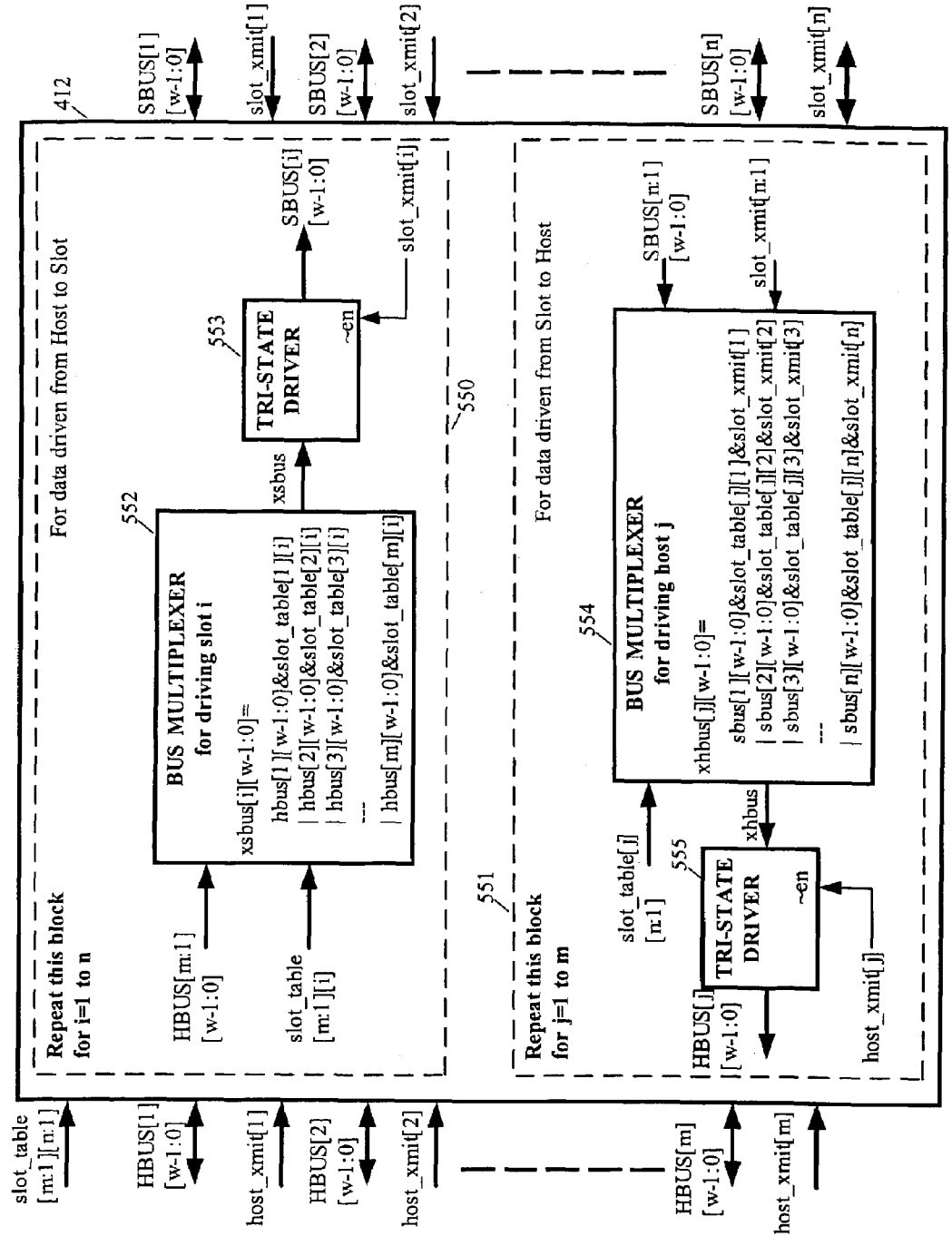
FIG. 18 shows a detailed view of the bus multiplexer in the multi-user server in accordance with one embodiment of the present invention.

The bus multiplexer 412 in the multi-user server 400 will now be discussed with reference to FIG. 18. As before, the number of hosts is designated by "m" and the number of slots is designated by "n," where n is greater than or equal to m. The number of bus width is designated by "w."

Note that the purpose of the bus mux 412 is to couple the host(s) to the slot(s) via the HBUS's and SBUS's so that they can pass data to each other. The bus mux 412 contains two main components—Host-to-Slot block 550 and Slot-to-Host block 551.

On the host side of the bus mux 412, various HBUS connections to the hosts are provided. Referring briefly to FIG. 13, HBUS1 couples bus mux 412 and host1, HBUS2 couples bus mux 412 and host2, HBUS3 couples bus mux 412 and host3, and so on, to HBUSm coupling bus mux 412 and hostm. In FIG. 18, HBUS[1][w-1:0] corresponds to HBUS1, and HBUS[m][w-1:0] corresponds to HBUSm, with a bus width of w. The host_xmit[m] controls whether HBUSm is enabled for data transmission. In this embodiment, each HBUS is bi-directional while host_xmit is unidirectional (host to slot only). The slot table[m:1][n:1] will also be fed to the bux mux 412.

On the slot side of the bus mux 412, various SBUS connections to the slot modules are provided. Referring briefly to FIG. 13, SBUS1 couples bus mux 412 and slot1, SBUS2 couples bus mux 412 and slot2, SBUS3 couples bus mux 412 and slot3, and so on, to SBUSn coupling bus mux 412 and slotn. Note that n can be greater than or equal to m. In FIG. 18, SBUS[1][w-1:0] corresponds to SBUS1, and SBUS[n][w-1: 0] corresponds to SBUSn, with a bus width of w. The slot_xmit[n] controls whether SBUSn is enabled for data transmission. In this embodiment, each SBUS is bi-directional while slot_xmit is unidirectional (slot to host only).

For data driven from the host to the slot(s), the Host-to-Slot block 550 includes a bus multiplexer 552 for driving slot i (for i=1 to n). Hence, this block drives data one slot (or columns in the slot table) at a time. This bus multiplexer 552 receives HBUS[m:1][w-1:0] and slot_table[m:1][i]. The bus multiplexer 552 sends data as follows:

$$xsbus[i][w-1:0] = hbus[1][w-1:0] \,\&\, slot\_table[1][i]$$
$$|\ hbus[2][w-1:0] \,\&\, slot\_table[2][i]$$
$$|\ ...$$
$$|\ hbus[m][w-1:0] \,\&\, slot\_table[m][i]$$

The "&" refers to the logic AND operation and the "|" refers to the logic "OR" operation. Transmission is controlled by the tri-state driver 553 and the slot_xmit[i] signal to the ~enable input. The output of the tri-state driver 553 is SBUS[i][w-1:0].

Thus, for "i" slots, there are "i" equations of xsbus[i][w-1:0]. So, if there are 10 slots, there are 10 equations of xsbus. Note that hbus is ANDed with the slot table. Depending on which element of the slot table is active, data is driven from the host to the slot across those active buses. In this embodiment, multiple hosts can drive data to multiple slots concurrently; that is, one host assigned to a particular slot can drive data to that particular slot at the same time as another host drives data to its assigned slot.

For data driven from the slot(s) to the host, the Slot-to-Host block 551 includes a bus multiplexer 554 for driving host j (for j=1 to m). Hence, this block drives data one host (or rows in the slot table) at a time. This bus multiplexer 554 receives slot_table[j][n:1], SBUS[n:1][w-1:0] and slot_xmit[n:1]. The bus multiplexer 554 sends data as follows:

$$xhbus[j][w-1:0] = sbus[1][w-1:0] \,\&\, slot\_table[j][1] \,\&\, slot\_xmit[1]$$
$$|\ sbus[2][w-1:0] \,\&\, slot\_table[j][2] \,\&\, slot\_xmit[2]$$
$$|\ ...$$
$$|\ sbus[n][w-1:0] \,\&\, slot\_table[j][n] \,\&\, slot\_xmit[n]$$

The "&" refers to the logic AND operation and the "|" refers to the logic "OR" operation. Transmission is controlled by the tri-state driver 555 and the host_xmit[j] signal to the ~enable input. The output of the tri-state driver 555 is HBUS[j][w-1:0].

Thus, for "j" hosts, there are "j" equations of xhbus[j][w-1:0]. So, if there are 10 hosts, there are 10 equations of xhbus. Note that sbus is ANDed with the slot table and the slot_xmit. Depending on which element of the slot table is active, data is driven from the slot to the host across those active buses. In this embodiment, multiple slots can drive data to multiple hosts concurrently; that is, one slot assigned to a particular host can drive data to that particular host at the same time as another slot drives data to its assigned host.

Note that while the arbitration of the host request for assignment of certain slots occurs one at a time, the data transfer among the hosts and slots can occur concurrently among all the hosts and assigned slots. An example is illustrative. Host A sends a request for slot A at substantially the same time as host B. The arbiter 411 determines host A as the winner and assigns slot A to host A. Host B is then assigned slot B. This arbitration occurs serially, or one at a time. The arbiter can only make one decision at a time for the assignment of slots. After all the hosts (or all the hosts that can be managed by the multi-user system based on load and capacity) have been assigned to the relevant slots, future transactions among the hosts and their respective slots can occur concurrently. Thus, while host A is communicating with slot A, host B can be communicating with slot B.

The multi-user server technology allows a plurality of host stations to configure, load, and execute multiple jobs in a reconfigurable hardware unit for emulation purposes (hardware acceleration), simulation purposes (obtain state values of hardware components for software simulation), and a combination of emulation and simulation. For emulation, any one of a plurality of host stations can request specific slot modules and, if the request is successful, load the hardware model of his user design into the slot modules of the reconfigurable hardware unit. Thereafter, he can run his job from any time t1 to another time t2. He can also run a simulation by loading the hardware state values from the hardware model in the reconfigurable hardware unit to his host station computer. Thereafter, he can simulate the operation of his user design in software only from time t3 to time t4. He can also run simulation and emulation together by advancing the simulation time step by step from time t5 to time t6, which includes simulating for that time period and also emulating for that same time period. When all the data has settled in the hardware model, the user can then advance to the next simulation time from time t6 to time 7. This scheme also applies to other users who are using other slot modules in the reconfigurable hardware unit to run his distinct user design. Indeed, depending on the number of slot modules and the size (and complexity) of the various user designs, any number of host stations can simultaneously access the reconfigurable hardware unit via the multi-user server to emulate, simulate, or perform a combination of emulation/simulation on their respective jobs.

Note that in this novel scheme, the arbitration system for the multiple hosts is accomplished in hardware. Control information is not embedded in the data stream of the host bus itself thus reducing overhead processing. Furthermore, reassignment of resources occurs electronically; that is, the user need not mechanically move cables or switches around. The system is scalable in that the number and configuration of the resources can be changed.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. One skilled in the art will readily appreciate that other applications may be substituted for those set forth herein without departing from the spirit and scope of the present invention. Accordingly, the invention should only be limited by the claims included below.

We claim:

1. A multi-user server for allowing a plurality of host stations to configure, load, and execute multiple jobs in a reconfigurable hardware unit, where each job is associated with a user design, and the reconfigurable hardware unit includes a plurality of hardware resources for modeling concurrently at least a portion of each user design, comprising:

a bus multiplexer;

a host bus for coupling the plurality of host stations to the bus multiplexer;

a slot bus for coupling the plurality of hardware resources to the bus multiplexer;

a bus arbiter for deciding which ones of the plurality of host stations will be assigned to which ones of the plurality of hardware resources; and a slot allocation table, coupled to the bus arbiter, for tracking which ones of the plurality of host stations are assigned to which ones of the plurality of hardware resources.

2. The multi-user server of claim 1 wherein each of the plurality of host stations includes control logic to deliver a request to the multi-user server.

3. The multi-user server of claim 1 wherein the plurality of hardware resources includes slot modules, where each slot module includes at least one board of FPGA chips for reconfigurably loading the user design as a hardware model.

4. The multi-user server of claim 2 wherein the plurality of hardware resources includes slot modules, where each slot module includes at least one board of FPGA chips for reconfigurably loading the user design as a hardware model.

5. The multi-user server of claim 4 wherein the request includes a command type and a slot number, the command type including one of a request status and a request slot, and the slot number indicates a particular one or more slot modules.

6. The multi-user server of claim 4 wherein the bus arbiter includes a status logic for delivering status information to the control logic in the host station in response to a request status by the host station.

7. The multi-user server of claim 3 wherein the plurality of host stations includes a first host station and a second host station, and the host bus includes a first host bus and a second host bus, where the first host bus is coupled between the first host station and the bus multiplexer, and the second host bus is coupled between the second host station and the bus multiplexer.

8. The multi-user server of claim 3 wherein the slot modules includes a first slot module and a second slot module, and the slot bus includes a first slot bus and a second slot bus, where the first slot bus is coupled between the first slot module and the bus multiplexer, and the second slot bus is coupled between the second slot module and the bus multiplexer.

9. The multi-user server of claim 7 wherein the slot modules includes a first slot module and a second slot module, and the slot bus includes a first slot bus and a second slot bus, where the first slot bus is coupled between the first slot module and the bus multiplexer, and the second slot bus is coupled between the second slot module and the bus multiplexer.

10. The multi-user server of claim 9 wherein the bus arbiter controls the bus multiplexer to couple the first host bus to the first slot bus, and the bus arbiter controls the bus multiplexer to couple the second host bus to the second slot bus.

11. The multi-user server of claim 10 wherein the data transfer between the first host bus and the first slot bus can occur concurrently with the data transfer between the second host bus and the second slot bus.

12. A multi-user server for allowing a plurality of host stations to configure, load, and execute multiple jobs comprising:
a bus multiplexer;
a host bus for coupling the plurality of host stations to the bus multiplexer;
a slot bus for coupling the plurality of hardware resources to the bus multiplexer;
a reconfigurable hardware unit coupled to the slot bus and including a plurality of hardware resources for modeling concurrently at least a portion of each of a plurality of user designs;
an arbiter for associating the plurality of host stations to the plurality of hardware resources; and
a slot allocation table, coupled to the bus arbiter, for tracking which ones of the plurality of host stations are assigned to which ones of the plurality of hardware resources.

13. The multi-user server of claim 12 wherein each of the plurality of host stations includes control logic to deliver a request to the simulation server.

14. The multi-user server of claim 12 wherein the plurality of hardware resources includes slot modules, where each slot module includes at least one board of FPGA chips for reconfigurably loading the user design as a hardware model.

15. The multi-user server of claim 13 wherein the plurality of hardware resources includes slot modules, where each slot module includes at least one board of FPGA chips for reconfigurably loading the user design as a hardware model.

16. The multi-user server of claim 15 wherein the request includes a command type and a slot number, the command type including one of a request status and a request slot, and the slot number indicates a particular one or more slot modules.

17. The multi-user server of claim 15 wherein the bus arbiter includes a status logic for delivering status information to the control logic in the host station in response to a request status by the host station.

18. The multi-user server of claim 14 wherein the plurality of host stations includes a first host station and a second host station, and the host bus includes a first host bus and a second host bus, where the first host bus is coupled between the first host station and the bus multiplexer, and the second host bus is coupled between the second host station and the bus multiplexer.

19. The multi-user server of claim 14 wherein the slot modules includes a first slot module and a second slot module, and the slot bus includes a first slot bus and a second slot bus, where the first slot bus is coupled between the first slot module and the bus multiplexer, and the second slot bus is coupled between the second slot module and the bus multiplexer.

20. The multi-user server of claim 18 wherein the slot modules includes a first slot module and a second slot module, and the slot bus includes a first slot bus and a second slot bus, where the first slot bus is coupled between the first slot module and the bus multiplexer, and the second slot bus is coupled between the second slot module and the bus multiplexer.

21. The multi-user server of claim 20 wherein the bus arbiter controls the bus multiplexer to couple the first host bus to the first slot bus, and the bus arbiter controls the bus multiplexer to couple the second host bus to the second slot bus, wherein the coupling effectuates communication between the first host bus and the first slot bus independently and concurrently with the communication between the second host bus and the second slot bus.

* * * * *